(12) United States Patent
Mori

(10) Patent No.: US 11,362,688 B2
(45) Date of Patent: Jun. 14, 2022

(54) RADIO FREQUENCY MODULE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/230,572

(22) Filed: Apr. 14, 2021

(65) Prior Publication Data

US 2021/0234559 A1 Jul. 29, 2021

Related U.S. Application Data

(63) Continuation of application No. PCT/JP2019/036427, filed on Sep. 17, 2019.

(30) Foreign Application Priority Data

Oct. 16, 2018 (JP) .............................. JP2018-195194

(51) Int. Cl.
*H04B 1/00* (2006.01)
*H04B 1/16* (2006.01)
*H04B 1/40* (2015.01)

(52) U.S. Cl.
CPC ........... *H04B 1/006* (2013.01); *H04B 1/0078* (2013.01); *H04B 1/1607* (2013.01); *H04B 1/40* (2013.01)

(58) Field of Classification Search
CPC .... H04B 1/006; H04B 1/0078; H04B 1/1607; H04B 1/40; H04B 1/0057; H04B 1/0458;
(Continued)

(56) References Cited

U.S. PATENT DOCUMENTS

2011/0102103 A1* 5/2011 Li ........................... H03H 7/175
333/175
2012/0293268 A1* 11/2012 Laurila ................... H03F 3/191
330/302
(Continued)

FOREIGN PATENT DOCUMENTS

JP 2012-175438 A 9/2012
JP 2013-247466 A 12/2013
(Continued)

OTHER PUBLICATIONS

International Search Report for International Patent Application No. PCT/JP2019/036427 dated Nov. 5, 2019.
(Continued)

*Primary Examiner* — Khanh C Tran
(74) *Attorney, Agent, or Firm* — Pearne & Gordon LLP

(57) ABSTRACT

A radio frequency module includes a radio frequency filter (10), and the radio frequency filter (10) includes a terminal (11), a terminal (12), an impedance element (Z) disposed in series on a path (13) connecting the terminal (11) and the terminal (12), and a parallel arm resonator (P) connected between a node (N) on the path (13) and the ground. The impedance element (Z) is a capacitor or an inductor, capacitance (C) between the ground and a wiring line (14) connecting the node (N) and the parallel arm resonator (P) is larger than capacitance between the ground and a wiring line (16) connecting the impedance element (Z) and a terminal out of the terminal (11) and the terminal (12) having a shorter wiring length to the impedance element (Z) (terminal (11), for example).

20 Claims, 22 Drawing Sheets

(58) Field of Classification Search
CPC ........ H04B 1/0475; H03H 9/542; H03H 9/64; H03H 9/72; H03H 9/68; H03H 9/56; H04L 27/148
See application file for complete search history.

(56) References Cited

U.S. PATENT DOCUMENTS

| | | |
|---|---|---|
| 2013/0314173 A1 | 11/2013 | Inoue |
| 2015/0084712 A1 | 3/2015 | Yamato |
| 2019/0312390 A1* | 10/2019 | Ramsey ................. H03H 7/09 |
| 2019/0348967 A1* | 11/2019 | Nosaka ............... H03H 9/6413 |
| 2020/0136592 A1* | 4/2020 | Nosaka ................. H03H 9/605 |

FOREIGN PATENT DOCUMENTS

| | | |
|---|---|---|
| WO | 2014/013832 A1 | 1/2014 |
| WO | 2017/188062 A1 | 11/2017 |

OTHER PUBLICATIONS

Written Opinion for International Patent Application No. PCT/JP2019/036427 dated Nov. 5, 2019.

* cited by examiner

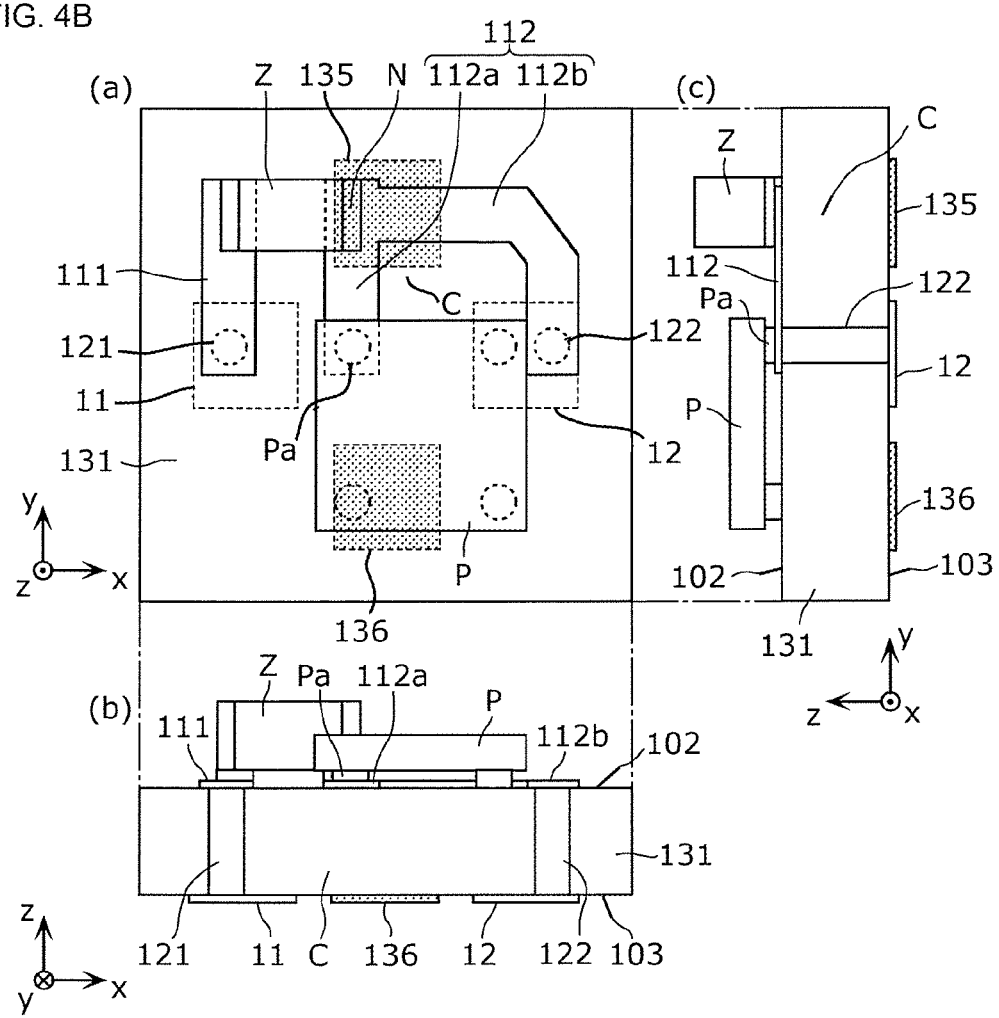

FIG. 5A

RADIO FREQUENCY MODULE

CROSS REFERENCE TO RELATED APPLICATIONS

This is a continuation of International Application No. PCT/JP2019/036427 filed on Sep. 17, 2019 which claims priority from Japanese Patent Application No. 2018-195194 filed on Oct. 16, 2018. The contents of these applications are incorporated herein by reference in their entireties.

BACKGROUND OF THE DISCLOSURE

Field of the Disclosure

The present disclosure relates to a radio frequency module.

Description of the Related Art

A ladder filter including an acoustic wave resonator has been known in the past (see Patent Document 1, for example). In the filter disclosed in Patent Document 1, an acoustic wave resonator is used in a parallel arm that generates series resonance at a frequency corresponding to an attenuation band.

Patent Document 1: Japanese Unexamined Patent Application Publication No. 2012-175438

BRIEF SUMMARY OF THE DISCLOSURE

In the above-mentioned filter in the past, such as an inductive component generated in a wiring line connected to the acoustic wave resonator causes a problem that steepness deteriorates in a lower frequency end or a higher frequency end of a pass band of the filter.

An object of the present disclosure is to provide a radio frequency module capable of increasing the steepness of the pass band end portion of the filter with a simple configuration.

In order to achieve the object above, a radio frequency module according to an aspect of the present disclosure is a radio frequency module including a radio frequency filter as follows. The radio frequency filter includes an input terminal, an output terminal, a first impedance element disposed in series on a path connecting the input terminal and the output terminal, and an acoustic wave resonator connected between a node on the path and a ground. The first impedance element is a capacitor or an inductor. Capacitance between the ground and a first wiring line connecting the node and the acoustic wave resonator is larger than capacitance between the ground and a second wiring line connecting the first impedance element and a terminal out of the input terminal and the output terminal having a shorter wiring length to the first impedance element.

According to the present disclosure, it is possible to provide a radio frequency module capable of increasing the steepness of a pass band end portion of a filter with a simple configuration.

BRIEF DESCRIPTION OF THE SEVERAL VIEWS OF THE DRAWINGS

FIG. 4B is a three-view drawing of the radio frequency module according to Example 2 of Embodiment 1.

FIG. 5A is a perspective view of a radio frequency module according to Example 3 of Embodiment 1.

DETAILED DESCRIPTION OF THE DISCLOSURE

Figure 1:
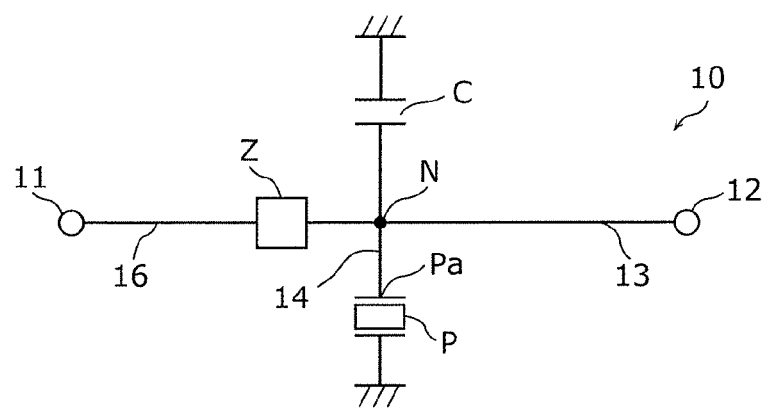
FIG. 1 is a circuit configuration diagram of a radio frequency filter included in a radio frequency module according to Embodiment 1.

Hereinafter, a radio frequency module according to an embodiment of the present disclosure will be described in detail with reference to the drawings. Note that each of the embodiments described below illustrates a specific example of the present disclosure. Numerical values, shapes, materials, constituent elements, arrangements and connection forms of the constituent elements, steps, the order of the steps, and the like illustrated in the following embodiments are merely examples, and are not intended to limit the present disclosure. Among the constituent elements in the following embodiments, constituent elements not recited in the independent claims will be described as optional constituent elements.

Each of the drawings is a schematic view and is not necessarily drawn accurately. Accordingly, scales and so on do not necessarily coincide with each other between the drawings, for example. In the drawings, substantially the same components are denoted by the same reference numerals, and redundant description will be omitted or simplified.

In addition, in the present description, a term indicating the relationship between elements such as parallel or vertical, a term indicating the shape of an element such as a rectangular parallelepiped or a cylinder, and a numerical range are not expressions having only a strict meaning, but expressions allowing a substantially equivalent range, for example, including a difference of about several percent.

In addition, in the present description, the terms "upper" and "lower" do not mean upper direction (perpendicularly upper) and lower direction (perpendicularly lower) in absolute spatial recognition, but are used as terms defined by a relative positional relationship based on a lamination order in a laminated structure.

In the present description and the drawings, an x-axis, a y-axis, and a z-axis indicate three axes of a three dimensional orthogonal coordinate system. In each of the embodiments, the z-axis direction is a thickness direction of a wiring substrate. In the present description, the term "thickness direction" refers to the thickness direction of the wiring substrate, which means a direction perpendicular to a main surface of the wiring substrate. The term "plan view" refers to the view taken from the direction vertical to the main surface of the wiring substrate.

Embodiment 1

Hereinafter, a configuration of a radio frequency filter included in a radio frequency module according to Embodiment 1 and an effect obtained by the configuration will be described first. Thereafter, a specific example of the radio frequency module according to the present embodiment will be described.

FIG. 1 is a circuit configuration diagram of a radio frequency filter 10 included in the radio frequency module according to the present embodiment. The radio frequency filter 10 includes a terminal 11, a terminal 12, an impedance element Z, a parallel arm resonator P, and a capacitance C as illustrated in FIG. 1. In the present embodiment, the radio frequency filter 10 is a high pass filter, but may be a low pass filter.

The terminals 11 and 12 are the input terminal and the output terminal of the radio frequency filter 10, respectively. The input terminal is a terminal for connecting the radio frequency module to an external circuit, and is a terminal to which a signal outputted from the external circuit is inputted. The output terminal is a terminal for connecting the radio frequency module to an external circuit, and is a terminal for outputting a signal processed by the radio frequency module to the external circuit. In the present embodiment, a case in which the terminal 11 is an input terminal and the terminal 12 is an output terminal will be described. Note that the terminal 11 may be an output terminal, and the terminal 12 may be an input terminal. That is, the impedance element Z may be provided in the input terminal side, or may be provided in the output terminal side.

A node N is provided on a path 13 connecting the terminal 11 and the terminal 12 as illustrated in FIG. 1. The node N is a branch point on the path 13.

The impedance element Z is an example of a first impedance element disposed in series on the path 13 connecting the terminal 11 and the terminal 12. Specifically, the impedance element Z is provided between the terminal 11 and the node N.

The impedance element Z is a capacitor or an inductor. The impedance element Z has a capacitance value or an inductance value determined in accordance with the filter characteristic required for the radio frequency filter 10.

Note that the capacitor is an element indicating capacitive property in the entire band as an ideal element, and does not include an acoustic wave resonator. This is because the acoustic wave resonator is not an element indicating the capacitive property in the entire band, although the acoustic wave resonator has an inductive property in a band between the resonant frequency and the anti-resonant frequency, and has a capacitive property in other bands.

The parallel arm resonator P is an example of the acoustic wave resonator connected between the node N and a ground. The acoustic wave resonator is a resonator using an acoustic wave, and examples thereof include a resonator using a surface acoustic wave (SAW), a resonator using a bulk acoustic wave (BAW), or a film bulk acoustic resonator (FBAR). Note that the SAW includes not only a surface wave but also a boundary wave.

In the present embodiment, a SAW resonator is used as the acoustic wave resonator. Accordingly, the parallel arm resonator P included in the radio frequency filter 10 can be constituted by an interdigital transducer (IDT) electrode formed on a substrate having piezoelectricity, and therefore, a small-sized and low-profile radio frequency module having a high degree of steepness in the attenuation characteristic may be achieved.

The substrate having piezoelectricity is a substrate having piezoelectricity at least on the surface thereof (hereinafter, referred to as piezoelectric substrate). The piezoelectric substrate may be provided with a piezoelectric thin film formed on the surface thereof, and may be constituted of a multilayer body of a film having a different acoustic velocity from that of the piezoelectric thin film, a support substrate, and the like, for example. Further, the piezoelectric substrate may be a multilayer body including a high-acoustic-velocity support substrate and a piezoelectric thin film formed on the high-acoustic-velocity support substrate, for example. The piezoelectric substrate may be a multilayer body including a high-acoustic-velocity support substrate, a low acoustic velocity film formed on the high-acoustic-velocity support substrate, and a piezoelectric thin film formed on the low-acoustic-velocity film. Alternatively, the piezoelectric substrate may be a multilayer body including a support substrate, a high-acoustic-velocity film formed on the support substrate, a low-acoustic-velocity film formed on the high-acoustic-velocity film, and a piezoelectric thin film formed on the low-acoustic-velocity film. Further, the piezoelectric substrate may have piezoelectricity in the entire substrate. The same applies to an acoustic wave resonator in other embodiments.

The capacitance C is capacitance between a wiring line 14 and the ground. The wiring line 14 is an example of a first wiring line connecting the node N and the parallel arm resonator.

Although details will be described later, the capacitance C is a capacitive component (also referred to as stray capacitance) generated by disposing a ground electrode connected to the ground in the vicinity of the wiring line 14. For example, the capacitance C is a parallel plate type capacitance having at least part of the wiring line 14 as a first electrode and having at least part of the ground electrode as a second electrode.

In the present embodiment, the capacitance C is larger than the capacitance between a wiring line 16 and the ground. The wiring line 16 is an example of a second wiring line connecting the impedance element Z and the terminal out of the terminals 11 and 12 having a shorter wiring length to the impedance element Z. The terminal having a shorter wiring length to the impedance element Z is the terminal 11 out of the terminals 11 and 12, since the node N is not provided on the path between the terminal 11 and the impedance element Z, for example. That is, the wiring line 16 is a wiring line connecting the terminal 11 and the impedance element Z in the present embodiment.

Here, there will be described a case where the terminal having a shorter wiring length to the impedance element Z is the terminal 11 which serves as the input terminal. However, the terminal may be the terminal 12 which serves as the output terminal. That is, the wiring length between the impedance element Z and the terminal 12 may be shorter than the wiring length between the impedance element Z and the terminal 11.

In a case where the wiring length of the wiring line included in the radio frequency filter 10 is long, an inductive component, a capacitive component, or both of these components are generated in the wiring line. In the radio frequency filter 10 according to the present embodiment, the filter characteristic of the radio frequency filter 10 is improved by using the capacitive component generated in the wiring line 14. Hereinafter, the effect caused by the generation of the capacitive component will be described with reference to FIGS. 2A, 2B and 2C.

Figure 2A:
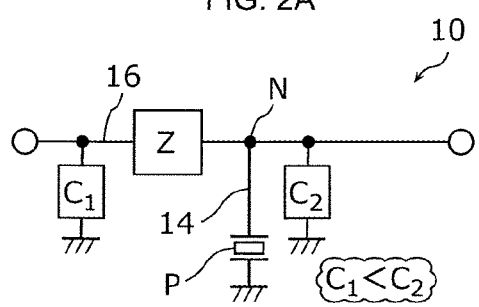
FIGS. 2A, 2B and 2C are diagrams for describing an effect caused by the generation of a large capacitive component in the radio frequency module according to Embodiment 1.
Figure 2B:
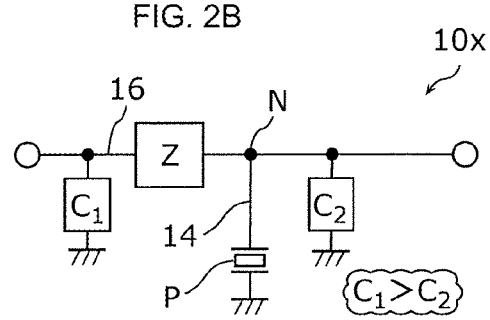
Figure 2C:
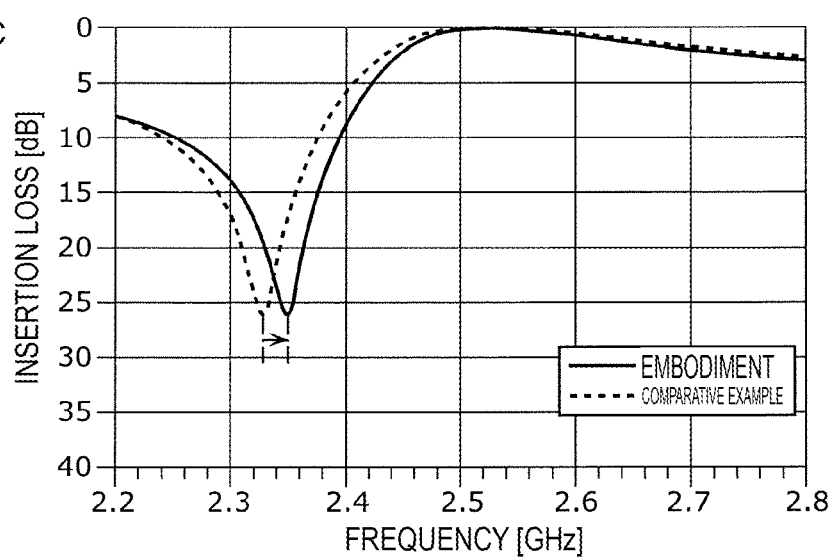

FIGS. 2A, 2B and 2C are diagrams for describing the effect caused by the generation of the capacitive component in the radio frequency module according to the present embodiment. FIG. 2A is a circuit diagram illustrating an equivalent circuit of the radio frequency filter 10 included in the radio frequency module according to the present embodiment. FIG. 2B is a circuit diagram illustrating an equivalent circuit of a radio frequency filter 10x according to a comparative example.

In each of FIGS. 2A and 2B, the magnitude of the capacitive component (capacitance value) generated in the wiring line 16 is denoted by $C_1$, and the magnitude of the capacitive component (capacitance value) generated in the wiring line 14 is denoted by $C_2$. That is, the capacitance value $C_2$ corresponds to the capacitance value of the capacitance C illustrated in FIG. 1.

In the radio frequency filter 10 according to the present embodiment, the capacitance value $C_2$ is larger than the capacitance value $C_1$. To the contrary, in the radio frequency filter 10x according to the comparative example, the capacitance value $C_2$ is smaller than the capacitance value $C_1$. The radio frequency filter 10x according to the comparative example is the same as the radio frequency filter 10 according to the embodiment except that the magnitude relationship between the capacitance values therein is different from that in the radio frequency filter 10. For example, in the radio frequency filter 10x, the ground electrode for increasing the capacitance $C_2$ is not provided in the vicinity of the wiring line 14.

FIG. 2C is a graph illustrating bandpass characteristics of the radio frequency filters 10 and 10x. In FIG. 2C, the horizontal axis represents frequency [unit: GHz], and the vertical axis represents insertion loss [unit: dB]. A solid line graph represents the insertion loss of the radio frequency filter 10 according to the present embodiment, and a dashed line graph represents the insertion loss of the radio frequency filter 10x according to the comparative example. FIG. 2C illustrates a simulation result when frequencies at which the insertion loss becomes the smallest coincide with each other between the radio frequency filter 10 and the radio frequency filter 10x.

Both of the radio frequency filters 10 and 10x include the parallel arm resonator P, which is an example of an acoustic wave resonator, and therefore, the radio frequency filters 10 and 10x have steep attenuation characteristic due to the steep attenuation pole of the acoustic wave resonator as illustrated in FIG. 2C. Specifically, in the radio frequency filter 10 in which the capacitance value $C_2$ is larger than the capacitance value $C_1$, the insertion loss becomes the maximum when the frequency is approximately 2.35 GHz. In the radio frequency filter 10x in which the capacitance value $C_2$ is smaller than the capacitance value $C_1$, the insertion loss becomes the maximum when the frequency is approximately 2.33 GHz. That is, when the capacitance value $C_2$ increases, the frequency at which the insertion loss becomes the maximum shifts to the higher frequency side.

As described above, in the radio frequency filter 10 according to the present embodiment, the capacitance value $C_2$ of the capacitance C generated in the wiring line 14 becomes larger than the capacitance value $C_1$ of the capacitance generated in the wiring line 16, and the steepness of the attenuation characteristic is increased. With this, even when an inductive component is generated in the wiring line 14, the steepness of the attenuation characteristic may be increased by increasing the capacitance value $C_2$ of the capacitance C generated in the wiring line 14. In order to increase the capacitance value $C_2$ of the capacitance C, it is sufficient to dispose the ground electrode in the vicinity of the wiring line 14, for example, and the steepness of the filter may be increased with a simple configuration.

Note that as the wiring length of the wiring line included in the radio frequency filter 10 is shorter, the generation of an unnecessary inductive component is suppressed more, and a preferable filter characteristic may be achieved. That is, as the total length of the wiring line included in the radio frequency filter 10 is shorter, the filter characteristic becomes more preferable.

However, in a radio frequency module, there may be a case where the wiring line cannot be sufficiently shortened because of the limitation of the physical arrangement of each of the terminals and each of the elements. For example, there may be a case where the positions of the terminal 11 and the terminal 12 are fixed, and the total length of the wiring line cannot be shortened because of the routing of the wiring line. Also, in the case above, the deterioration of the filter characteristic may be suppressed by adjusting the magnitude of the capacitance C generated in the wiring line 14.

Hereinafter, a specific example of a radio frequency module including the radio frequency filter 10 according to the present embodiment will be described. Note that the arrangements and shapes of elements, wiring substrates, wiring layers, and vias in the respective examples below are merely examples, and are not limited to the described examples.

Example 1

First, a radio frequency module according to Example 1 will be described with reference to FIG. 3A and FIG. 3B.

Figure 3A:
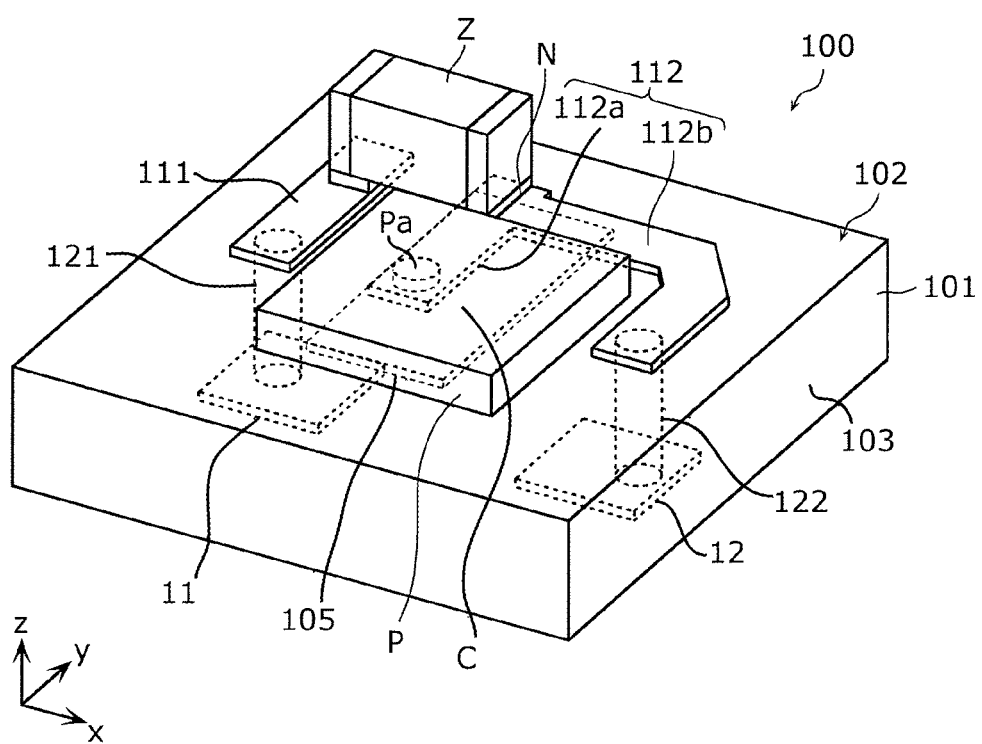
FIG. 3A is a perspective view of a radio frequency module according to Example 1 of Embodiment 1.

FIG. 3A is a perspective view of a radio frequency module 100 according to the present example. In FIG. 3A, the dashed lines illustrate the terminals 11 and 12, and portions of a wiring structure included in the radio frequency module 100 that cannot be seen in the perspective view. In addition, in the perspective view, only a node N side terminal Pa among a plurality of terminals of the parallel arm resonator P is illustrated in order to avoid complication. The above illustration manner also applies to other perspective views described later (specifically, FIG. 4A, FIG. 5A, FIG. 6A, FIG. 8A, FIG. 10A, FIG. 11A, FIG. 13A, and FIG. 15A).

Figure 3B:
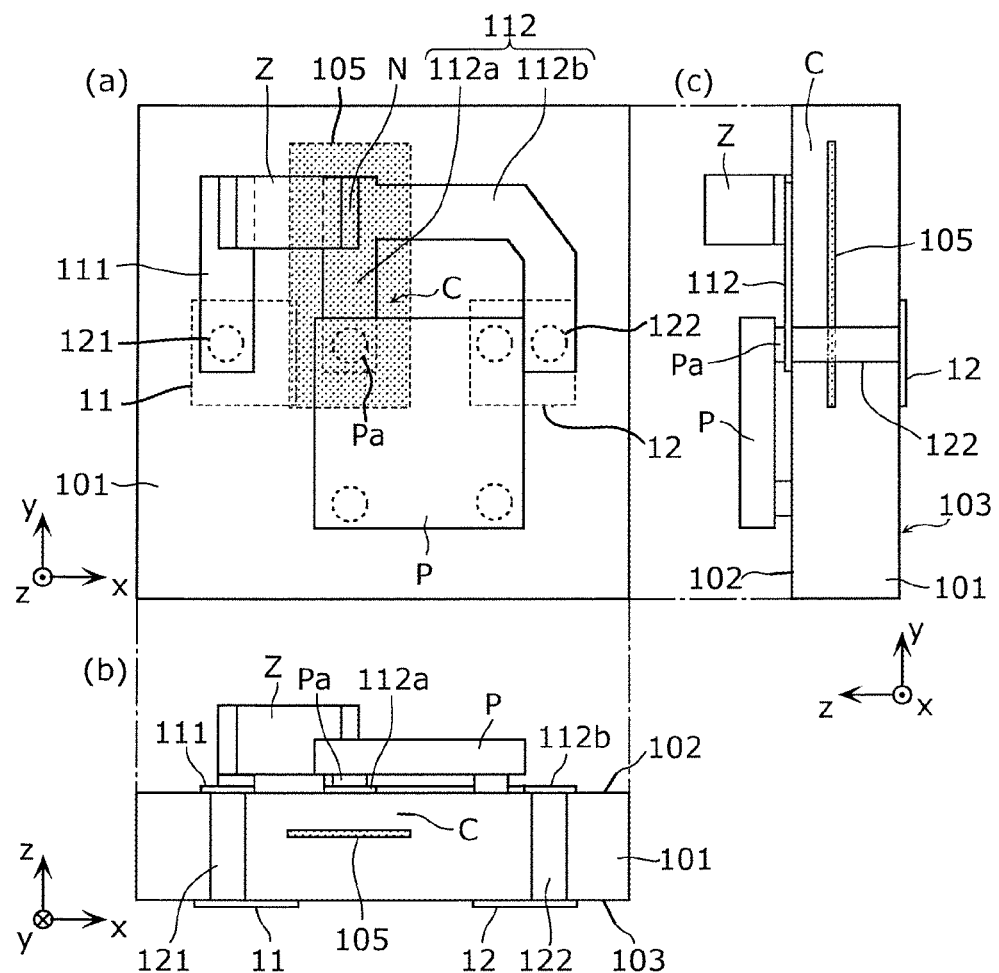
FIG. 3B is a three-view drawing of the radio frequency module according to Example 1 of Embodiment 1.

FIG. 3B is a three-view drawing of the radio frequency module 100 according to the present example. The portions (a), (b), and (c) of FIG. 3B are a top plan, an elevation, and a right side elevation of the radio frequency module 100, respectively. Note that, in the present description, a top view is the case when the radio frequency module 100 is viewed from the positive side of the z-axis, a front elevation view is the case when the radio frequency module 100 is viewed from the negative side of the y-axis, and a right side elevation view is the case when the radio frequency module 100 is viewed from the positive side of the x-axis. That is, a top view is synonymous with a plan view of a front surface 102 of a wiring substrate 101. The same applies to other examples and other embodiments.

In (a) of FIG. 3B, the terminal 11, the terminal 12, the terminal Pa of the parallel arm resonator P, and part of the wiring structure such as a via 121 in the radio frequency filter 10 are indicated by the dashed lines. In (b) and (c) of FIG. 3B, wiring structures (specifically, vias 121 and 122) provided in the wiring substrate 101 are illustrated by the seeing through of the wiring substrate 101. In the seeing through, a wiring structure visible from the seeing through point (that is, near side wiring structure) is represented by a solid line, and a wiring structure overlapping with the near side wiring structure and at the same time being positioned behind the near side wiring structure is represented by a dashed line. Further, the ground electrodes in each of the drawings are shaded with dots. The above illustration manner also applies to other three-view drawings described later (specifically, FIG. 4B, FIG. 5B, FIG. 6B, FIG. 8B, FIG. 10B, FIG. 11B, FIG. 13B, and FIG. 15B).

The radio frequency module 100 includes the wiring substrate 101 and a ground electrode 105 as illustrated in FIG. 3A and FIG. 3B.

The wiring substrate 101 has the front surface 102 and a back surface 103 that are facing away from each other as illustrated in FIG. 3A. The front surface 102 is an example of a first surface being a main surface of the wiring substrate 101. The back surface 103 is an example of a second surface being a main surface of the wiring substrate 101.

In the present example, the parallel arm resonator P and the impedance element Z are provided on the front surface 102 of the wiring substrate 101 as illustrated in FIG. 3A and FIG. 3B. The terminals 11 and 12 are provided on the back surface 103 of the wiring substrate 101. Note that the positions where the terminal 11, the terminal 12, the parallel arm resonator P, and the impedance element Z are provided are not limited to those described above. For example, at least one of the terminals 11 and 12 may be provided on the front surface 102 or a side surface of the wiring substrate 101.

The terminals 11 and 12 are conductive thin films patterned in a predetermined shape, for example. The terminals 11 and 12 are formed using a metal material such as silver (Ag) or copper (Cu), for example. The shapes of the terminals 11 and 12 in top view are square, but may be circular or rectangular. The shape and size of each of the terminals 11 and 12 are not particularly limited.

As the wiring substrate 101, a resin multilayer substrate, a low temperature co-fired ceramics (LTCC) multilayer substrate having a multilayer structure of a plurality of dielectric layers, or the like is used, for example. The shape of the wiring substrate 101 is a flat rectangular parallelepiped, for example, but is not limited thereto. The shape of the wiring substrate 101 may be a cylinder, or may be a polyhedron other than a rectangular parallelepiped.

The wiring substrate 101 includes one or more wiring layers extending in a direction parallel to the front surface 102, and one or more vias extending in a direction orthogonal to the front surface 102. The terminal 11, the terminal 12, the impedance element Z, and the parallel arm resonator P are respectively connected to at least one of the one or more wiring layers and the one or more vias. For example, the parallel arm resonator P and the impedance element Z are mounted on the front surface 102 of the wiring substrate 101 by being connected to a wiring layer or a via by using solder or the like. The terminal Pa of the parallel arm resonator P and the terminal of the impedance element Z are formed of solidified solder or the like, for example. Note that the method of mounting the parallel arm resonator P and the impedance element Z is not particularly limited. The terminal Pa of the parallel arm resonator P may be a bump electrode, for example. In other examples and other embodiments, the method of mounting the impedance element and the parallel arm resonator is the same as that of the present example.

The wiring substrate 101 includes a wiring layer 111, a wiring layer 112, the via 121, and the via 122 in the present example as illustrated in FIG. 3A and FIG. 3B.

The wiring layers 111 and 112 are conductive pattern wiring lines provided on the front surface 102 of the wiring substrate 101. The wiring layers 111 and 112 are formed such that a metal thin film of silver (Ag) or copper (Cu) or the like is formed on the front surface 102, and then, the metal thin film is patterned in a predetermined shape, for example. Both of the wiring layers 111 and 112 extend in a direction parallel to the front surface 102, that is, in a direction orthogonal to the thickness direction (z-axis direction) of the wiring substrate 101. The widths and the film thicknesses of the wiring layers 111 and 112 are the same, for example, but may be different from each other.

The via 121 and the impedance element Z are connected to the wiring layer 111. The wiring layer 111 linearly extends along the y-axis direction from the upper end portion of the via 121 to one end of the impedance element Z as illustrated in FIG. 3A and (a) of FIG. 3B. The shape of the wiring layer 111 in top view is rectangular, for example, but is not limited thereto.

The impedance element Z, the parallel arm resonator P, and the via 122 are connected to the wiring layer 112. The wiring layer 112 includes a first wiring portion 112a and a second wiring portion 112b as illustrated in FIG. 3A and (a) of FIG. 3B. The connection portion of the first wiring portion 112a and the second wiring portion 112b is the branch point of the wiring layer 112, and corresponds to the node N.

The impedance element Z and the parallel arm resonator P are connected to the first wiring portion 112a. The first wiring portion 112a linearly extends along the y-axis direction from the other end of the impedance element Z to the terminal Pa of the parallel arm resonator P.

The impedance element Z and the via 122 are connected to the second wiring portion 112b. The second wiring portion 112b bends and extends from the other end of the impedance element Z to the upper end portion of the via 122.

The shape of the wiring layer 112 in top view is a U-shape, for example, but is not limited thereto. The second wiring portion 112b may linearly extend, and the shape of the wiring layer 112 in top view may be a V-shape or an L-shape, for example.

The vias 121 and 122 are conductive members extending along the thickness direction of the wiring substrate 101. In the present example, the vias 121 and 122 penetrate through the wiring substrate 101 from the front surface 102 to the back surface 103 thereof. The vias 121 and 122 are formed such that a through hole is formed by a laser or the like in the wiring substrate 101, and then, a conductive material (conductive paste, for example) such as silver (Ag) or copper (Cu) is filled thereto, for example. The method of forming the vias 121 and 122 is not particularly limited. In the present example, the shape of each of the vias 121 and 122 is columnar, but may be prismatic. The shape of each of the vias 121 and 122 is not particularly limited. The cross-sectional areas of the vias 121 and 122 are the same, for example, but may be different from each other.

The terminal 11 and the wiring layer 111 are connected to the via 121. The via 121 is provided so as to overlap with both the wiring layer 111 and the terminal 11 in top view.

The terminal 12 and the wiring layer 112 are connected to the via 122. The via 122 is provided so as to overlap with both the wiring layer 112 and the terminal 12 in top view.

Here, the correspondence between the wiring structure included in the radio frequency module 100 according to the present example and the wiring line included in the radio frequency filter 10 illustrated in FIG. 1 will be described.

In the present example, the path 13 connecting the terminal 11 and the terminal 12 is constituted of the via 121, the wiring layer 111, the second wiring portion 112b of the wiring layer 112, and the via 122. The path 13 includes the wiring line 16 and the node N as illustrated in FIG. 1. The node N is the branch point of the wiring layer 112, and corresponds to the connection portion of the first wiring portion 112a and the second wiring portion 112b. Further, the wiring line 14 branched from the path 13 at the node N is constituted of the first wiring portion 112a of the wiring layer 112. The wiring line 16 included in the path 13 is constituted of the via 121 and the wiring layer 111.

The ground electrode 105 is connected to the ground. The ground electrode 105 is not connected to the terminals 11 and 12, the path 13, and the wiring line 14. Specifically, the ground electrode 105 is not connected to any of the terminals 11 and 12, the wiring layers 111 and 112, and the vias 121 and 122.

The ground electrode 105 overlaps with the wiring line 14 when the front surface 102 of the wiring substrate 101 is viewed in plan view. In the present example, the wiring line 14 is constituted of the first wiring portion 112a, and therefore, the ground electrode 105 overlaps with the first wiring portion 112a as illustrated in FIG. 3A and FIG. 3B. Accordingly, the capacitance C is generated between the first wiring portion 112a and the ground electrode 105. The ground electrode 105 is larger than the first wiring portion 112a, and the entire first wiring portion 112a is positioned inside the ground electrode 105 in top view, for example.

Alternatively, part of the first wiring portion 112a may not overlap with the ground electrode 105 in top view. The ground electrode 105 may be smaller than the first wiring portion 112a, and the entire ground electrode 105 may be positioned inside the first wiring portion 112a in top view. The shape and size of the ground electrode 105 in top view may be the same as the shape and size of the first wiring portion 112a in top view. The ground electrode 105 and the first wiring portion 112a may completely coincide with each other in contours in top view.

Further, the ground electrode 105 does not overlap with the wiring layer 111 being part of the wiring line 16 in top view. Note that the ground electrode 105 may overlap with the wiring layer 111 in top view. In this case, the ground electrode 105 may be provided such that the area of the portion overlapping with the first wiring portion 112a is larger than the area of the portion overlapping with the wiring layer 111, for example.

In the present example, the ground electrode 105 is provided in the wiring substrate 101. The ground electrode 105 is a conductive pattern electrode provided in the wiring substrate 101, for example. The ground electrode 105 is formed such that a metal thin film of silver (Ag) or copper (Cu) or the like is formed while constructing the lamination structure of the wiring substrate 101, and then, the metal thin film is patterned in a predetermined shape, for example. The ground electrode 105 extends in a direction parallel to the front surface 102, that is, in a direction orthogonal to the thickness direction (z-axis direction) of the wiring substrate 101. The shape of the ground electrode 105 in top view is rectangular, for example, but is not limited thereto.

The ground electrode 105 is positioned closer to the front surface 102 than the back surface 103 of the wiring substrate 101 as illustrated in (b) and (c) of FIG. 3B. As the distance between the ground electrode 105 and the first wiring portion 112a is shorter, the capacitance C may be made larger. For example, the ground electrode 105 is provided at a position where the distance to the first wiring portion 112a constituting the wiring line 14 is shorter than the distance to the wiring layer 111 included in the wiring line 16.

Note that the surface of the ground electrode 105 facing the via 121 is an end face of the ground electrode 105 and is sufficiently small. With this, the distance between the ground electrode 105 and the via 121 included in the wiring line 16 may be shorter than the distance between the ground electrode 105 and the first wiring portion 112a. The capacitance generated between the ground electrode 105 and the wiring line 16 may be made smaller than the capacitance C generated between the wiring line 14 (first wiring portion 112a) and the ground electrode 105.

Note that, the ground connected to the ground electrode 105 and the parallel arm resonator P is not illustrated in FIG. 3A and FIG. 3B. The ground is provided on the back surface 103 of the wiring substrate 101 being electrically insulated from the terminals 11 and 12, for example. The ground and the ground electrode 105 are connected using such as a via (not illustrated). The same applies to the ground and the parallel arm resonator P. The ground may be provided in the wiring substrate 101, or may be provided on the front surface 102. The same applies to other examples and other embodiments.

With the above-mentioned configuration, the capacitance C between the ground and the wiring line 14 connecting the node N and the parallel arm resonator P becomes larger than the capacitance between the wiring line 16 and the ground in the radio frequency module 100 according to the present example, and therefore, the steepness of the pass band end portion of the radio frequency filter 10 may be increased with a simple configuration as described with reference to FIGS. 2A, 2B and 2C.

Note that in order to increase the capacitance C, the wiring length of the wiring line 14 may be elongated. Specifically, the length of the first wiring portion 112a may be elongated.

Figure 3C:
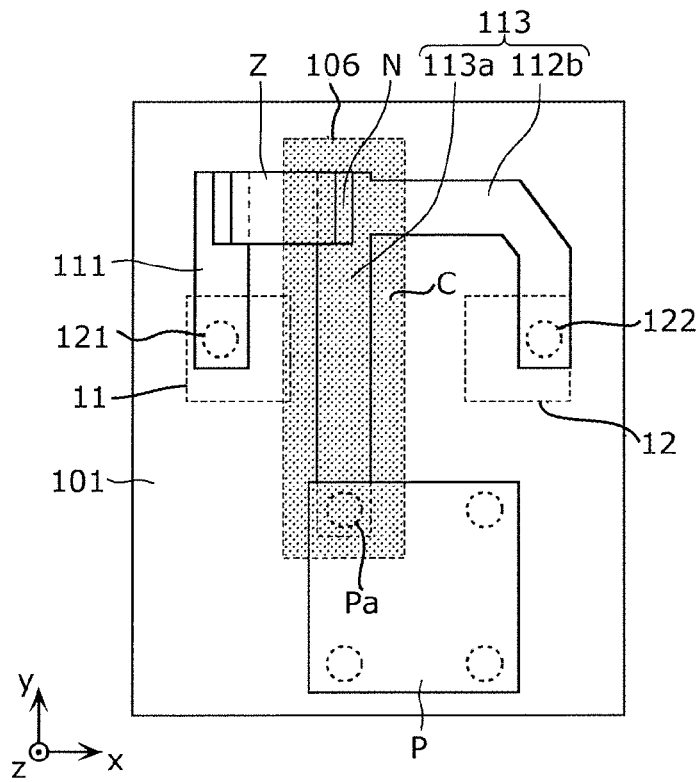
FIG. 3C is a top plan of a radio frequency module according to a modification of Example 1 of Embodiment 1.

FIG. 3C is a top plan of a radio frequency module according to a modification of the present example. The radio frequency module according to the present modification includes a wiring layer 113 and a ground electrode 106 instead of the wiring layer 112 and the ground electrode 105 as illustrated in FIG. 3C. The wiring layer 113 includes a first wiring portion 113a and the second wiring portion 112b.

The first wiring portion 113a is longer than the first wiring portion 112a according to Example 1. Specifically, the length of the first wiring portion 113a is longer than the total length of the wiring layer 111 and the via 121. Accordingly, the wiring length of the wiring line 14 (length of first wiring portion 113a) is longer than the wiring length of the wiring line 16 (total length of via 121 and wiring layer 111).

The ground electrode 106 has a shape longer than that of the ground electrode 105 according to Example 1. The ground electrode 106 overlaps with the first wiring portion 113a in top view. Accordingly, the capacitance C is generated between the ground electrode 106 and the first wiring portion 113a. The ground electrode 106 is larger than the first wiring portion 113a, and the entire first wiring portion 113a is positioned inside the ground electrode 106 in top view, for example.

The area of the overlapping portion of the first wiring portion 113a and the ground electrode 106 is larger than the area of the overlapping portion of the first wiring portion 112a and the ground electrode 105 according to Example 1. With this, the capacitance value of the capacitance C according to the present modification is larger than that in Example 1. Thus, according to the present modification, the steepness of the pass band end portion of the radio frequency filter 10 may further be increased.

Example 2

Next, a radio frequency module according to Example 2 will be described with reference to FIG. 4A and FIG. 4B. The radio frequency module according to the present example is different compared to the radio frequency module according to Example 1 in that the ground electrode is provided on the back surface 103 of the wiring substrate. In the following description, the points different from Example 1 will mainly be described, and the description of points in common will be omitted or simplified.

Figure 4A:
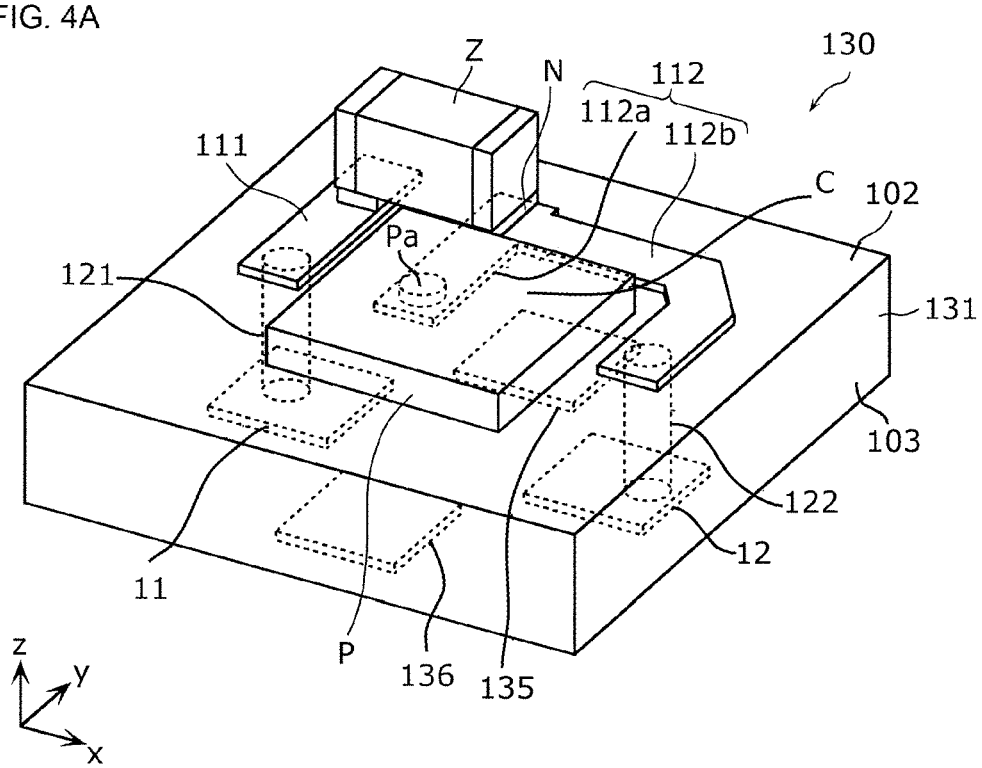
FIG. 4A is a perspective view of a radio frequency module according to Example 2 of Embodiment 1.

FIG. 4A is a perspective view of a radio frequency module 130 according to the present example. FIG. 4B is a three-view drawing of the radio frequency module 130 according to the present example. The portions (a), (b), and (c) of FIG. 4B are a top plan, an elevation, and a right side elevation of the radio frequency module 130, respectively.

The radio frequency module 130 includes a wiring substrate 131 and ground electrodes 135 and 136 as illustrated in FIG. 4A and FIG. 4B. The wiring substrate 131 is the same as the wiring substrate 101 except that no ground electrode is provided in the wiring substrate 131.

Each of the ground electrodes 135 and 136 corresponds to the ground electrode 105, and has a shape, a size, and an arrangement being different from those of the ground electrode 105. Specifically, the ground electrodes 135 and 136 are provided on the back surface 103 of the wiring substrate 131 as illustrated in (b) and (c) of FIG. 4B. The ground electrodes 135 and 136 each are conductive pattern electrodes provided on the back surface 103 of the wiring substrate 131, for example. Each of the ground electrodes 135 and 136 is a terminal connecting the radio frequency module 130 to an external circuit, and is connected to the ground wiring line of the external circuit and the like, for example.

In the present example, the ground electrode 135 overlaps with the first wiring portion 112a (wiring line 14) in top view. Accordingly, the capacitance C is generated between the ground electrode 135 and the first wiring portion 112a. Part of the ground electrode 135 and part of the first wiring portion 112a overlap with each other in top view, for example. The shape of the ground electrode 135 in top view is square, for example, but is not limited thereto.

The ground electrode 136 does not overlap with the first wiring portion 112a (wiring line 14) in top view. With this, the capacitance, which is smaller than the capacitance generated between the ground electrode 135 and the first wiring portion 112a, is generated between the ground electrode 136 and the first wiring portion 112a. Accordingly, the capacitance generated between the wiring line 14 and the ground may be made larger than in the case where the ground electrode 136 is not provided.

With the above-mentioned configuration, the capacitance C between the ground and the wiring line 14 connecting the node N and the parallel arm resonator P becomes larger than the capacitance between the wiring line 16 and the ground in the radio frequency module 130 according to the present example, and therefore, the steepness of the pass band end portion of the radio frequency filter 10 may be increased with a simple configuration as described with reference to FIGS. 2A, 2B and 2C.

Further, according to the present example, the ground electrodes 135 and 136 are provided on the back surface 103, and therefore, the ground electrodes 135 and 136 may be formed in the same process as that of the terminals 11 and 12, for example. Thus, the capacitance C between the wiring line 14 and the ground may easily be increased while suppressing an increase in the number of processes in the manufacturing process.

Example 3

Next, a radio frequency module according to Example 3 will be described with reference to FIG. 5A and FIG. 5B. The radio frequency module according to the present example is different compared to the radio frequency module according to Example 1 in that the impedance element Z and the wiring structure are provided in the wiring substrate. In the following description, the points different from Examples 1 or 2 will mainly be described, and the description of points in common will be omitted or simplified.

Figure 5A:
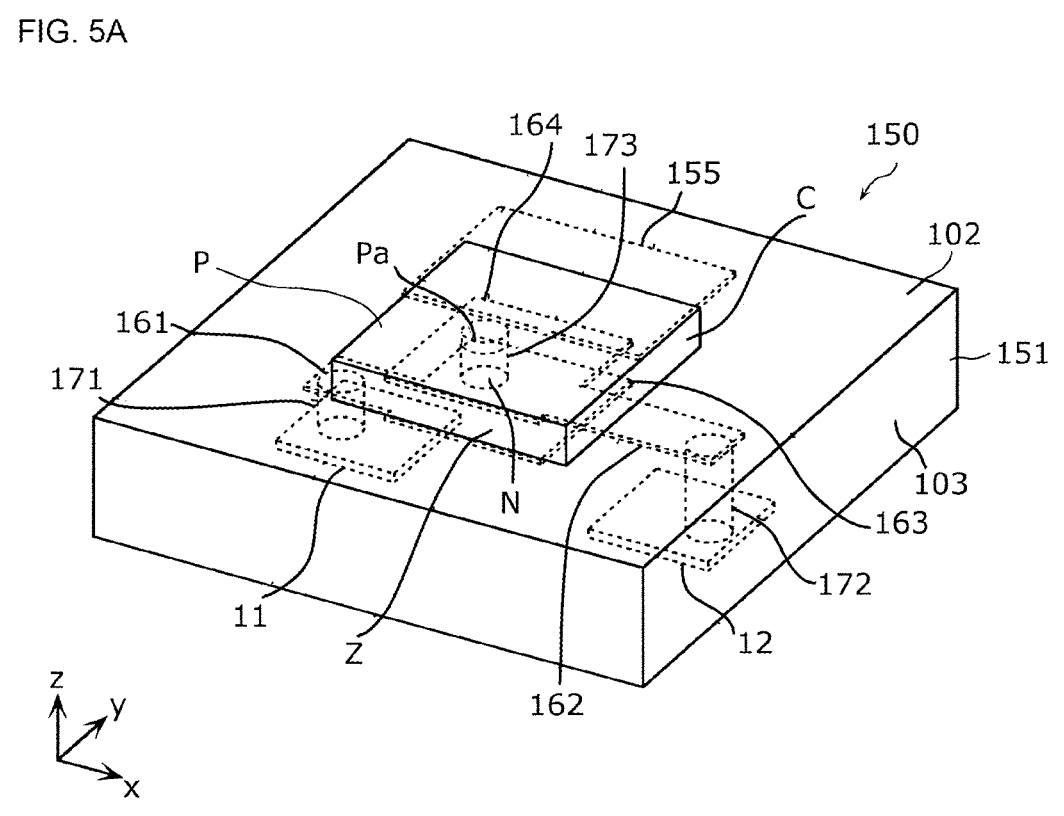
Figure 5B:
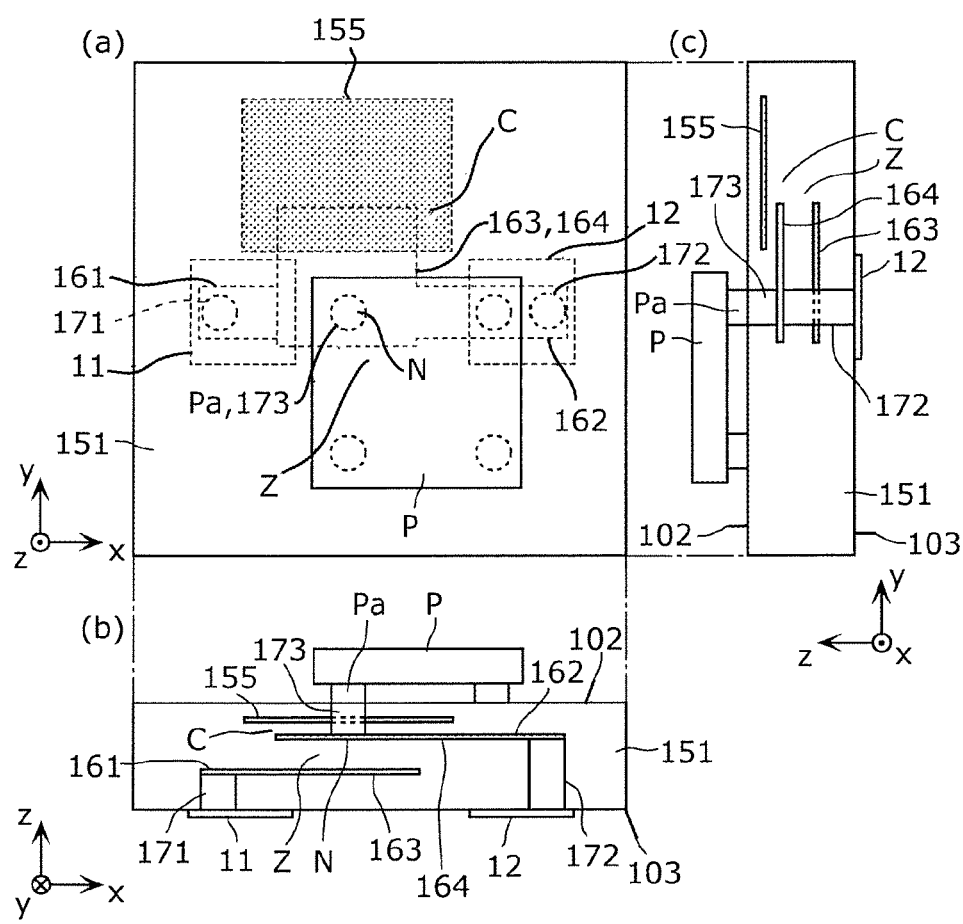
FIG. 5B is a three-view drawing of the radio frequency module according to Example 3 of Embodiment 1.

FIG. 5A is a perspective view of a radio frequency module 150 according to the present example. FIG. 5B is a three-view drawing of the radio frequency module 150 according to the present example. The portions (a), (b), and (c) of FIG. 5B are a top plan, an elevation, and a right side elevation of the radio frequency module 150, respectively.

The radio frequency module 150 includes a wiring substrate 151 and a ground electrode 155 as illustrated in FIG. 5A and FIG. 5B.

The wiring substrate 151 is the same as the wiring substrate 101 excluding the following: the number and the shapes of the wiring layers and the vias included in the wiring substrate 151 are different from those of the wiring substrate 101; the impedance element Z is provided in the wiring substrate 151. The wiring substrate 151 includes a wiring layer 161, a wiring layer 162, a via 171, a via 172, and a via 173 in the present example as illustrated in FIG. 5A and FIG. 5B.

The impedance element Z is a capacitor, and includes an electrode plate 163 and an electrode plate 164 in the present example. The electrode plates 163 and 164 are positioned in the wiring substrate 151. The electrode plates 163 and 164 are disposed to face each other with a predetermined distance, and constitute a so-called parallel plate electrode. When the front surface 102 of the wiring substrate 151 is viewed in plan view, the electrode plate 163 and the electrode plate 164 overlap with each other. Each of the electrode plates 163 and 164 corresponds to the terminal of the impedance element Z, and also functions as part of the wiring line.

The electrode plates 163 and 164 each are conductive pattern electrodes provided in the wiring substrate 151. The electrode plates 163 and 164 are formed such that a metal thin film of silver (Ag) or copper (Cu) or the like is formed while constructing the lamination structure of the wiring substrate 151, and then, the metal thin film is patterned in a predetermined shape, for example.

The wiring layers 161 and 162 are conductive pattern wiring lines provided in the wiring substrate 151. In the present example, the wiring layers 161 and 162 are positioned in the same layer as the electrode plates 163 and 164 of the impedance element Z, respectively. The wiring layer 161 is formed in the same process as that of the electrode plate 163, and the wiring layer 162 is formed in the same process as that of the electrode plate 164, for example. Both of the wiring layers 161 and 162 extend in a direction parallel to the front surface 102, that is, in a direction orthogonal to the thickness direction (z-axis direction) of the wiring substrate 151.

The via 171 and the impedance element Z are connected to the wiring layer 161. The wiring layer 161 linearly extends along the x-axis direction from the upper end portion of the via 171 to the electrode plate 163 as illustrated in FIG. 5B. The shape of the wiring layer 161 in top view is rectangular, for example, but is not limited thereto. The wiring layer 161 and the electrode plate 163 are integrally formed.

The via 172 and the impedance element Z are connected to the wiring layer 162. The wiring layer 162 linearly extends along the x-axis direction from the upper end portion of the via 172 to the electrode plate 164 as illustrated in FIG. 5B. The shape of the wiring layer 162 in top view is rectangular, for example, but is not limited thereto. The wiring layer 162 and the electrode plate 164 are integrally formed.

The wiring layer 162 and the electrode plate 164 are provided at positions closer to the front surface 102 than the back surface 103 in the thickness direction of the wiring substrate 151 as illustrated in (b) and (c) of FIG. 5B. For example, the distance between the front surface 102 and each of the wiring layer 162 and the electrode plate 164, that is, the length of the via 173 is equal to or shorter than the distance between the back surface 103 and each of the wiring layer 161 and the electrode plate 163, that is, the length of the via 171. Alternatively, the wiring layer 162 and the electrode plate 164 may be provided at positions closer to the back surface 103 than the front surface 102.

The vias 171, 172, and 173 are conductive members extending along the thickness direction of the wiring substrate 151. The vias 171 and 172 are embedded in recesses that are recessed from the back surface 103 toward the front surface 102 of the wiring substrate 151 in the present example. The via 173 is embedded in a recess that is recessed from the front surface 102 toward the back surface 103 of the wiring substrate 151. That is, the vias 171, 172, and 173 do not penetrate through the wiring substrate 151. Each of the vias 171, 172, and 173 is formed such that a recess not penetrating through is formed in the wiring substrate 151 by a laser or the like, and then, a conductive material (conductive paste, for example) such as silver (Ag) or copper (Cu) is filled thereto, for example. The method for forming the vias 171, 172, and 173 is not particularly limited. In the present example, the shape of each of the vias 171, 172, and 173 is columnar, but may be prismatic. The shape of each of the vias 171, 172, and 173 is not particularly limited. The vias 171, 172, and 173 have the same cross-sectional area, for example, but may have different cross-sectional areas.

The terminal 11 and the wiring layer 161 are connected to the via 171. The via 171 is provided so as to overlap with the wiring layer 161 and the terminal 11 in top view.

The terminal 12 and the wiring layer 162 are connected to the via 172. The via 172 is provided so as to overlap with the wiring layer 162 and the terminal 12 in top view.

The impedance element Z and the parallel arm resonator P are connected to the via 173. The via 173 is provided so as to overlap with the electrode plate 164 of the impedance element Z and the terminal Pa of the parallel arm resonator P in top view. Note that the via 173 may be connected to the wiring layer 162 instead of the impedance element Z.

Here, the correspondence between the wiring structure included in the radio frequency module 150 according to the present example and the wiring line included in the radio frequency filter 10 illustrated in FIG. 1 will be described.

In the present example, the path 13 connecting the terminal 11 and the terminal 12 is constituted of the via 171, the wiring layer 161, the electrode plate 163, the electrode plate 164, the wiring layer 162, and the via 172. The node N is a connection point of the electrode plate 164 and the via 173. The wiring line 14 branched from the path 13 is constituted of the via 173. Further, the wiring line 16 included in the path 13 is constituted of the via 171, the wiring layer 161, and the electrode plate 163. Note that the electrode plate 164 corresponds to a wiring line connecting the impedance element Z and the node N.

The ground electrode 155 corresponds to the ground electrode 105, and has a shape, a size, and an arrangement being different from those of the ground electrode 105. Specifically, the ground electrode 155 is provided in the wiring substrate 151, and is positioned between the electrode plate 164 and the front surface 102 in the thickness direction of the wiring substrate 151 as illustrated in FIG. 5A and FIG. 5B.

Specifically, the ground electrode 155 is provided at a position overlapping with the electrode plate 164 in top view. That is, the ground electrode 155 overlaps with the impedance element Z in top view. Part of the ground electrode 155 and part of the electrode plate 164 overlap with each other in top view, for example. The shape of the ground electrode 155 in top view is rectangular, for example, but is not limited thereto. The ground electrode 155 may overlap with the wiring layer 162 or may overlap with the via 172 in top view, for example. Note that, the ground electrode 155 may not overlap with the parallel arm resonator P in top view, but may overlap with the parallel arm resonator P.

According to the configuration above, the capacitance C is generated between the ground electrode 155 and the electrode plate 164. The ground electrode 155 does not overlap with the via 171 or the wiring layer 161 that are included in the wiring line 16 in top view as illustrated in (a) of FIG. 5B. Although the ground electrode 155 overlaps with the electrode plate 163, the electrode plate 164 is provided between the ground electrode 155 and the electrode plate 163 as illustrated in (c) of FIG. 5B. With this, the capacitance generated between the ground electrode 155 and the wiring line 16 may be reduced.

With the above-mentioned configuration, the capacitance C between the ground and the wiring line 14 connecting the node N and the parallel arm resonator P becomes larger than the capacitance between the wiring line 16 and the ground in the radio frequency module 150 according to the present example, and therefore, the steepness of the pass band end portion of the radio frequency filter 10 may be increased with a simple configuration as described with reference to FIGS. 2A, 2B and 2C.

Example 4

Next, a radio frequency module according to Example 4 will be described with reference to FIG. 6A and FIG. 6B. The radio frequency module according to the present example is different compared to the radio frequency module according to Example 3 in that the ground electrode is provided below the impedance element Z in the thickness direction of the wiring substrate. In the following description, the points different from Example 3 will mainly be described, and the description of points in common will be omitted or simplified.

Figure 6A:
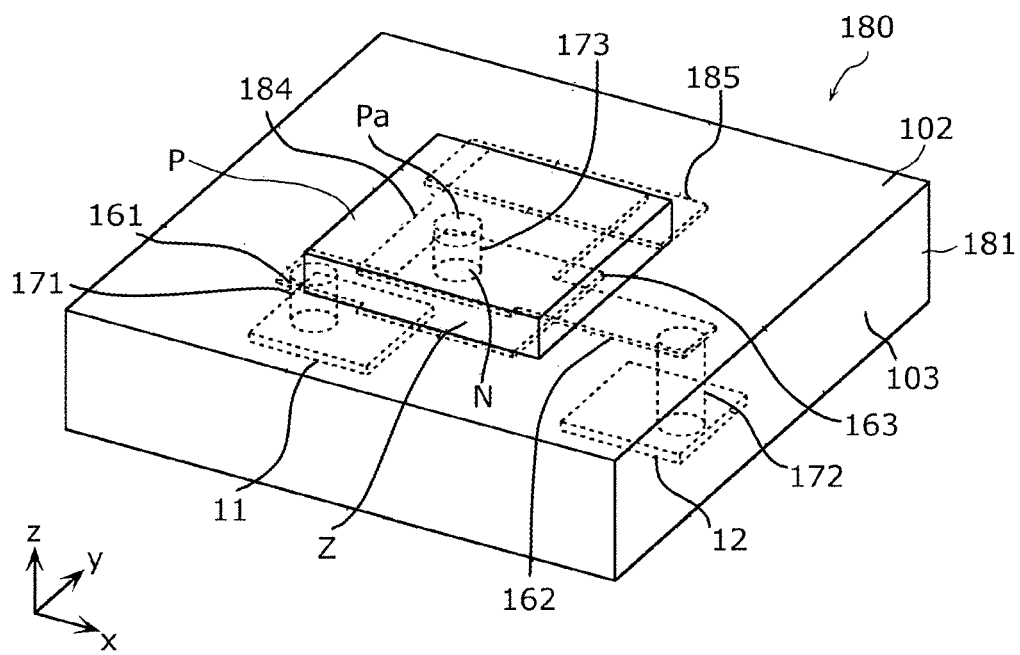
FIG. 6A is a perspective view of a radio frequency module according to Example 4 of Embodiment 1.

FIG. 6A is a perspective view of a radio frequency module 180 according to the present example. FIG. 6B is a three-view drawing of the radio frequency module 180 according to the present example. The portions (a), (b), and (c) of FIG. 6B are a top plan, an elevation, and a right side elevation of the radio frequency module 180, respectively.

Figure 6B:
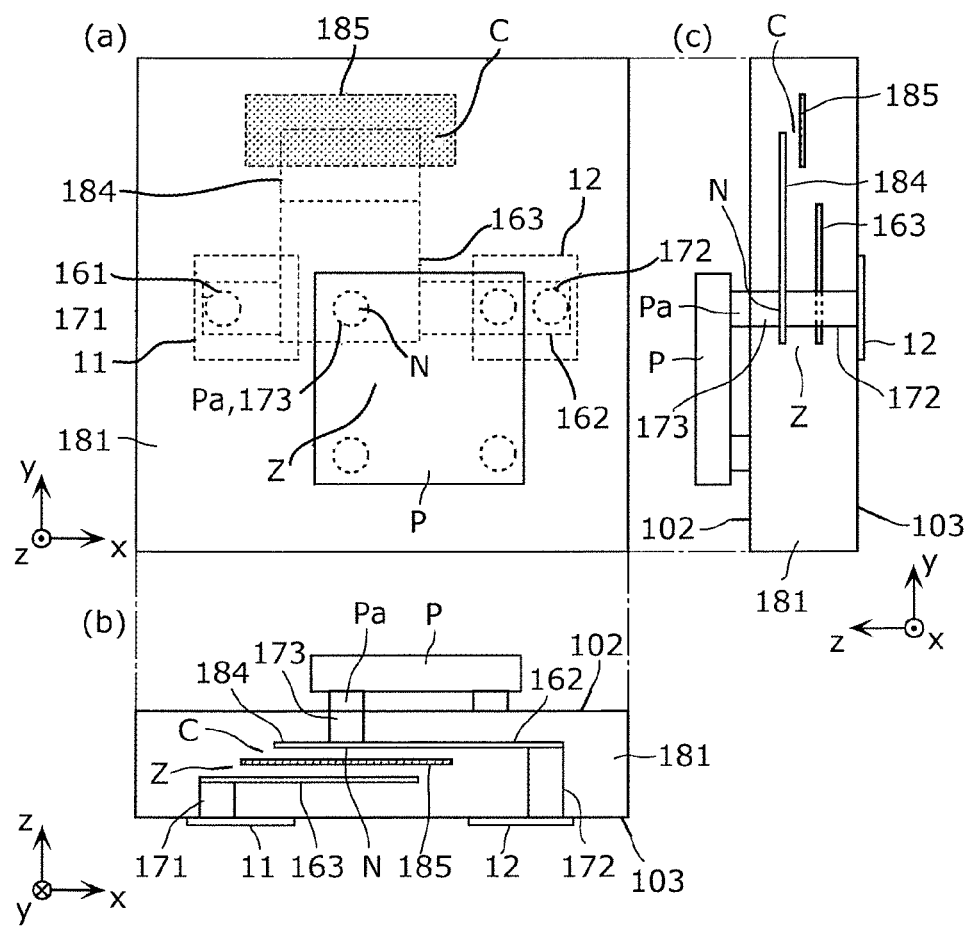
FIG. 6B is a three-view drawing of the radio frequency module according to Example 4 of Embodiment 1.

The radio frequency module 180 includes a wiring substrate 181 and a ground electrode 185 as illustrated in FIG. 6A and FIG. 6B. The wiring substrate 181 is the same as the wiring substrate 151 according to Example 3 excluding the following: the position of the ground electrode 185 provided therein is different; the wiring substrate 181 includes an electrode plate 184 instead of the electrode plate 164 of the impedance element Z provided therein.

The electrode plate 184 has a different shape compared to that of the electrode plate 164 of the impedance element Z according to Example 3. Specifically, the electrode plate 184 has a rectangular shape in top view and is larger than the electrode plate 163.

The ground electrode 185 corresponds to the ground electrode 155, and has a shape, a size, and an arrangement being different from those of the ground electrode 155. Specifically, the ground electrode 185 is provided in the wiring substrate 181, and is positioned between the electrode plate 184 and the back surface 103 in the thickness direction of the wiring substrate 181 as illustrated in FIG. 6A and FIG. 6B. More specifically, the ground electrode 185 is positioned between the electrode plate 184 and the electrode plate 163 in the thickness direction of the wiring substrate 181. The ground electrode 185 may be positioned at a center between the electrode plate 163 and the electrode plate 184 or at a position closer to the electrode plate 184 than the electrode plate 163 in the thickness direction of the wiring substrate 181, for example.

The ground electrode 185 is provided at a position overlapping with the electrode plate 184 in top view. That is, the ground electrode 185 overlaps with the impedance element Z in top view. Part of the ground electrode 185 and part of the electrode plate 184 overlap with each other in top view, for example. The shape of the ground electrode 185 in top view is rectangular, for example, but is not limited thereto. The ground electrode 185 may overlap with the wiring layer 162 or may overlap with the via 173 in top view, for example. Note that, the ground electrode 185 does not overlap with the parallel arm resonator P in top view, but may overlap with the parallel arm resonator P.

According to the configuration above, the capacitance C is generated between the ground electrode 185 and the electrode plate 184. Note that, the ground electrode 185 does not overlap with the via 171 or the wiring layer 161 included in the wiring line 16 in top view as illustrated in (a) of FIG. 6B. Further, the ground electrode 185 does not overlap with the electrode plate 163.

With the above-mentioned configuration, the capacitance C between the ground and the wiring line 14 connecting the node N and the parallel arm resonator P becomes larger than the capacitance between the wiring line 16 and the ground in the radio frequency module 180 according to the present example, and therefore, the steepness of the pass band end portion of the radio frequency filter 10 may be increased with a simple configuration as described with reference to FIGS. 2A, 2B and 2C.

[Conclusion]

As described above, the radio frequency module according to the present embodiment is a radio frequency module including a radio frequency filter, and the radio frequency filter includes an input terminal, an output terminal, a first impedance element disposed in series on a path connecting the input terminal and the output terminal, and an acoustic wave resonator connected between a node on the path and a ground. The first impedance element is a capacitor or an inductor. The capacitance between the ground and a first wiring line connecting the node and the acoustic wave resonator is larger than the capacitance between the ground and a second wiring line that connects the first impedance element and the terminal out of the input terminal and the output terminal having the shorter wiring length to the first impedance element.

Accordingly, even when an unnecessary inductive component is generated in the parallel arm resonator P, increasing the capacitance C between the first wiring line and the ground enables the increase of the steepness of the attenuation characteristic as described with reference to FIGS. 2A, 2B and 2C. The capacitance C may easily be increased by arranging the ground electrode in the vicinity of the first wiring line, for example. Thus, it is possible to achieve a radio frequency module capable of increasing the steepness of the pass band end portion of the filter with a simple configuration.

In addition, the radio frequency module further includes a ground electrode connected to the ground, and a wiring substrate having a first surface and a second surface that are opposed to each other, for example. The acoustic wave resonator is provided on the first surface, and the input terminal and the output terminal are provided on the second surface. The ground electrode overlaps with the first wiring line, or a wiring line connecting the first impedance element and the node when the first surface is viewed in plan view.

Accordingly, providing the ground electrode may increase the capacitance C between the first wiring line and the ground with a simple configuration. Further, since the input terminal and the output terminal can be provided on the same surface of the wiring substrate, the radio frequency module may easily be mounted on another circuit substrate or the like. For example, one time mounting may achieve the connection of both the input terminal and the output terminal.

Further, the first impedance element is provided in the wiring substrate, and at the same time, in a position overlapping with the acoustic wave resonator when the first surface is viewed in plan view, for example.

Accordingly, since the number of elements mounted on the surface of the wiring substrate may be reduced, the flexibility in layout may be improved.

The ground electrode may be provided between the first surface and the first impedance element in the wiring substrate, for example. Further, the ground electrode may be provided in the wiring substrate or on the second surface of the wiring substrate, for example.

As described above, since the position of the ground electrode is not particularly limited, the degree of freedom in layout at the wiring substrate may be increased.

Further, the wiring substrate includes one or more wiring layers extending in a direction parallel to the first surface, and one or more vias extending in a direction orthogonal to the first surface, for example. Each of the input terminal, the output terminal, the first impedance element, and the acoustic wave resonator is connected to at least one of the one or more wiring layers and the one or more vias. The node is a branch point in one wiring layer out of the one or more wiring layers, or a connection point of one wiring layer out of the one or more wiring layers and one via out of the one or more vias.

Accordingly, adjusting the arrangement of the wiring layer or the via enables to easily obtain the desired capacitance between the ground electrode and the wiring layer or the via. That is, appropriate design of the layout of each element, each wiring line, and the ground electrode makes it possible to easily increase the capacitance C between the ground and the wiring line connecting the node N and the parallel arm resonator P, and makes it possible to increase the steepness of the pass band end portion of the filter.

Further, the wiring length of the first wiring line is longer than the wiring length of the second wiring line, for example.

Accordingly, the capacitance C may easily be increased by elongating the first wiring line.

Note that the inductive component or the capacitive component generated in the wiring line also varies depending on the wiring width. With this, when a wiring having a different wiring line width is included, a wiring length may be regarded as a value normalized by the wiring width.

Embodiment 2

Next, a radio frequency module according to Embodiment 2 will be described.

The radio frequency module according to the present embodiment is different compared to the radio frequency module according to Embodiment 1 in the circuit configuration of the radio frequency filter included in the radio frequency module. Hereinafter, the points different from Embodiment 1 will mainly be described, and the description of points in common will be omitted or simplified.

Figure 7:
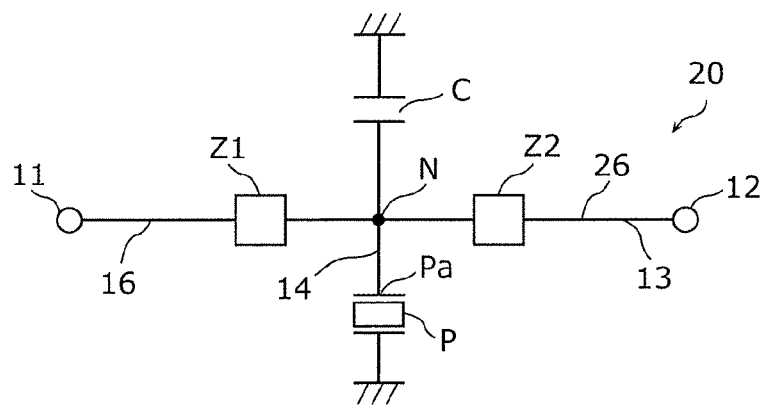
FIG. 7 is a circuit configuration diagram of a radio frequency filter included in a radio frequency module according to Embodiment 2.

FIG. 7 is a circuit configuration diagram of a radio frequency filter 20 included in the radio frequency module according to the present embodiment. The radio frequency filter 20 newly includes an impedance element Z2 as compared with the radio frequency filter 10 according to Embodiment 1 as illustrated in FIG. 7. The radio frequency filter 20 is a high pass filter, for example, but may be a low pass filter, or may be a band pass filter or a notch filter.

Note that, an impedance element Z1 is illustrated in FIG. 7 instead of the impedance element Z for convenience of description, but the impedance element Z1 is the same as the impedance element Z according to Embodiment 1.

The impedance element Z2 is an example of a second impedance element disposed in series on the path 13. In the present embodiment, the node N is positioned between the impedance element Z1 and the impedance element Z2.

The impedance element Z2 is a capacitor or an inductor. The impedance element Z2 is an impedance element of the same type as the impedance element Z1. That is, both of the impedance elements Z1 and Z2 are capacitors. Alternatively, both of the impedance elements Z1 and Z2 may be inductors.

In the present embodiment, the capacitance C is larger than the capacitance between a wiring line 26 and the ground. The wiring line 26 is an example of a third wiring line connecting the impedance element Z2 and the terminal out of the terminals 11 and 12 having a shorter wiring length to the impedance element Z2. The terminal having a shorter wiring length to the impedance element Z2 is the terminal 12 out of the terminals 11 and 12, since the node N is not provided on the path between the terminal 12 and the impedance element Z2, for example. That is, in the present embodiment, the wiring line 26 is a wiring line connecting the terminal 12 and the impedance element Z2. Here, there will be described a case where the terminal having a shorter wiring length to the impedance element Z2 is the terminal 12 which serves as the output terminal. However, the terminal may be the terminal 11 which serves as the input terminal.

With the above-mentioned configuration, the capacitance C between the ground and the wiring line 14 connecting the node N and the parallel arm resonator P becomes larger than the capacitance between the wiring line 26 and the ground, and therefore, the steepness of the pass band end portion of the radio frequency filter 20 may be increased with a simple configuration as described with reference to FIGS. 2A, 2B and 2C.

The capacitance C is larger than the capacitance between the wiring line 16 and the ground as with Embodiment 1. That is, in the present embodiment, the capacitance C is larger than any of the capacitance between the wiring line 16 and the ground, and the capacitance between the wiring line 26 and the ground. Accordingly, the steepness of the pass band end portion of the radio frequency filter 20 may be increased with a simple configuration.

Hereinafter, a specific example of a radio frequency module including the radio frequency filter 20 according to the present embodiment will be described. Note that the arrangements and shapes of elements, wiring substrates, wiring layers, and vias in the respective examples below are merely examples, and are not limited to the described examples.

EXAMPLE

A radio frequency module according to an example of the present embodiment will be described with reference to FIG.

Figure 8A:
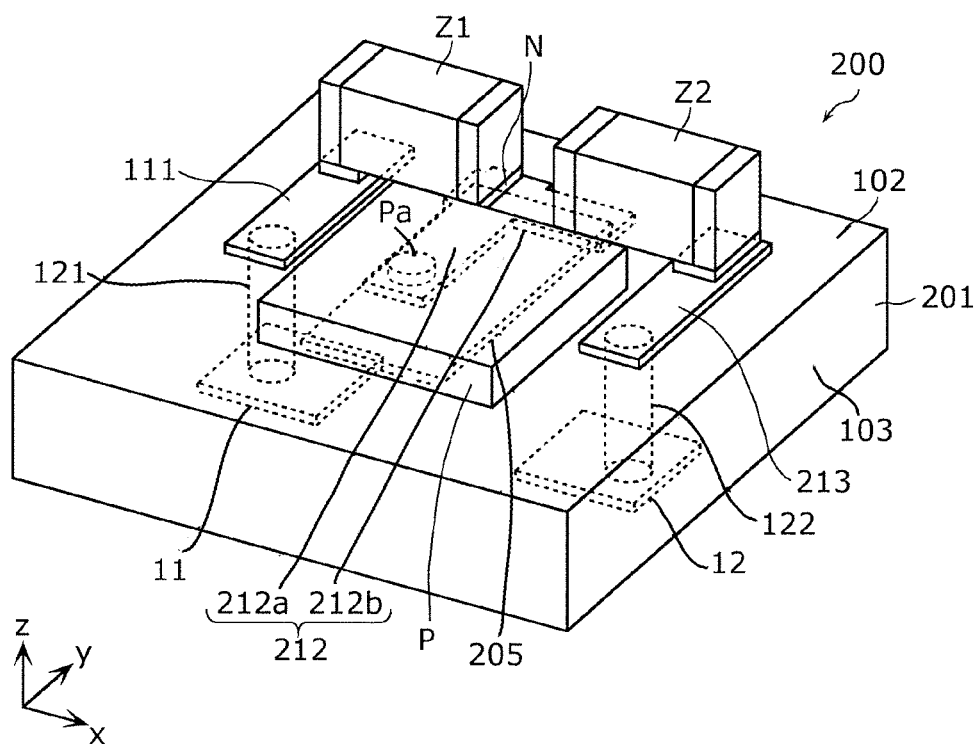
FIG. 8A is a perspective view of a radio frequency module according to an example of Embodiment 2.
Figure 8B:
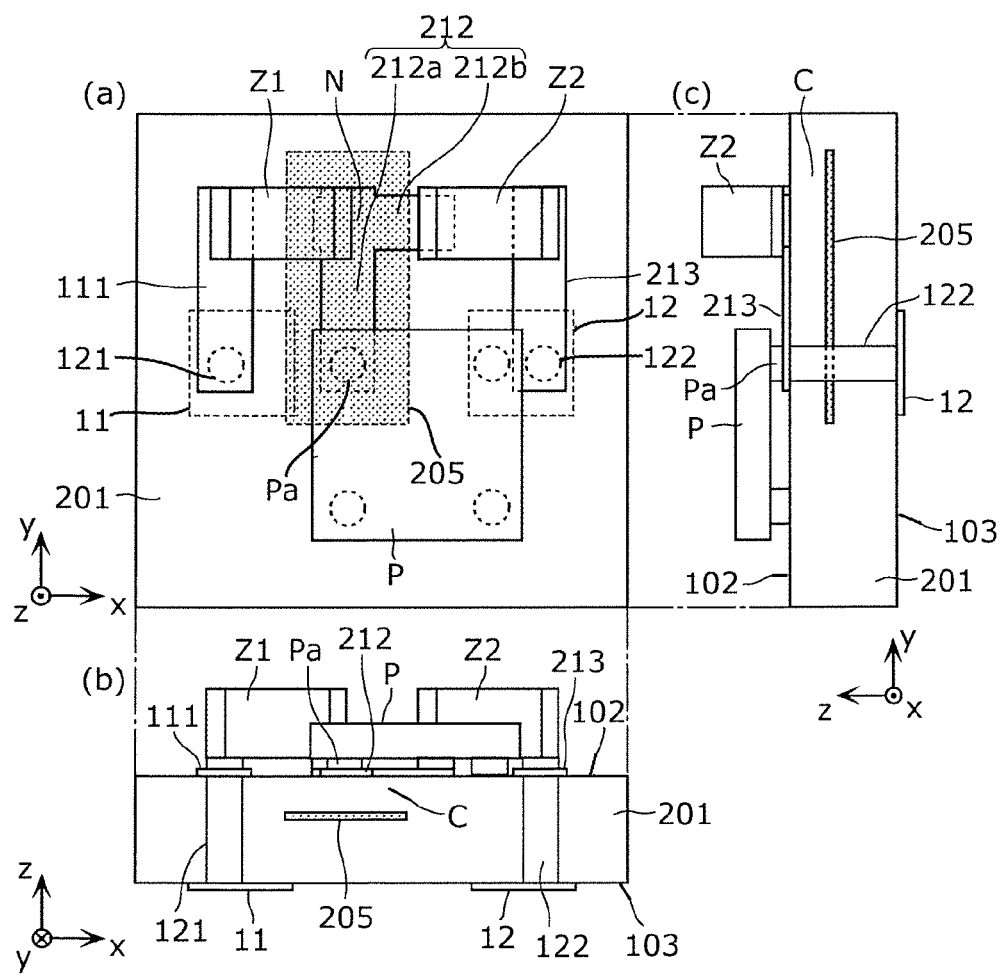
FIG. 8B is a three-view drawing of the radio frequency module according to the example of Embodiment 2.

8A and FIG. 8B. In the following description, the points different from Examples 1 to 4 of Embodiment 1 will mainly be described, and the description of points in common will be omitted or simplified.

FIG. 8A is a perspective view of a radio frequency module 200 according to the present example. FIG. 8B is a three-view drawing of the radio frequency module 200 according to the present example. The portions (a), (b), and (c) of FIG. 8B are a top plan, an elevation, and a right side elevation of the radio frequency module 200, respectively.

The radio frequency module 200 includes a wiring substrate 201 and a ground electrode 205 as illustrated in FIG. 8A and FIG. 8B.

The wiring substrate 201 is the same as the wiring substrate 101 according to Example 1 of Embodiment 1 except that the number and the shapes of wiring layers included in the wiring substrate 201 are different from those of the wiring substrate 101. On the front surface 102 of the wiring substrate 201, the parallel arm resonator P, the impedance elements Z1 and Z2 are provided.

The wiring substrate 201 includes the wiring layer 111, a wiring layer 212, a wiring layer 213, the via 121, and the via 122 in the present example as illustrated in FIG. 8A and FIG. 8B. The wiring layer 111, the vias 121 and 122 are the same as those in Example 1 of Embodiment 1.

The wiring layers 212 and 213 are conductive pattern wiring lines provided on the front surface 102 of the wiring substrate 201. The wiring layers 212 and 213 are formed such that a metal thin film of silver (Ag) or copper (Cu) or the like is formed on the front surface 102, and then, the metal thin film is patterned in a predetermined shape, for example. Both of the wiring layers 212 and 213 extend in a direction parallel to the front surface 102, that is, in a direction orthogonal to the thickness direction (z-axis direction) of the wiring substrate 201. The widths and the film thicknesses of the wiring layers 212 and 213 are the same, for example, but may be different from each other.

The impedance element Z1, the parallel arm resonator P, and the impedance element Z2 are connected to the wiring layer 212. The wiring layer 212 includes a first wiring portion 212a and a second wiring portion 212b as illustrated in FIG. 8A and (a) of FIG. 8B. The connection portion of the first wiring portion 212a and the second wiring portion 212b is a branch point of the wiring layer 212, and corresponds to the node N.

The impedance element Z1 and the parallel arm resonator P are connected to the first wiring portion 212a. The first wiring portion 212a linearly extends along the y-axis direction from one end of the impedance element Z1 to the terminal Pa of the parallel arm resonator P.

The impedance element Z1 and the impedance element Z2 are connected to the second wiring portion 212b. The second wiring portion 212b linearly extends along the x-axis direction from one end of the impedance element Z1 to one end of the impedance element Z2.

The shape of the wiring layer 212 in top view is an L-shape, for example, but is not limited thereto. The shape of the wiring layer 212 in top view may be a V-shape, for example.

The impedance element Z2 and the via 122 are connected to the wiring layer 213. The wiring layer 213 linearly extends along the y-axis direction from the other end of the impedance element Z2 to the upper end portion of the via 122 as illustrated in FIG. 8A and (a) of FIG. 8B. The shape of the wiring layer 213 in top view is rectangular, for example, but is not limited thereto.

Here, the correspondence between the wiring structure included in the radio frequency module 200 according to the present example and the wiring line included in the radio frequency filter 20 illustrated in FIG. 7 will be described.

In the present example, the path 13 connecting the terminal 11 and the terminal 12 is constituted of the via 121, the wiring layer 111, the second wiring portion 212b of the wiring layer 212, the wiring layer 213, and the via 122. The path 13 includes the wiring line 16, the node N, and the wiring line 26 as illustrated in FIG. 7. The node N is a branch point of the wiring layer 212, and corresponds to the connection portion of the first wiring portion 212a and the second wiring portion 212b. Further, the wiring line 14 branched from the path 13 at the node N is constituted of the first wiring portion 212a of the wiring layer 212. The wiring line 16 is the same as that in Example 1 of Embodiment 1. Further, the wiring line 26 is constituted of the wiring layer 213 and the via 122.

The ground electrode 205 is the same as the ground electrode 105 according to Example 1 of Embodiment 1. In the present example, the ground electrode 205 overlaps with the first wiring portion 212a in top view. Accordingly, the capacitance C is generated between the first wiring portion 212a and the ground electrode 205.

The ground electrode 205 does not overlap with any of the wiring layer 111 and the wiring layer 213 in top view. With this, the capacitance generated between the ground electrode 205 and each of the wiring layers 111 and 213 is smaller than the capacitance C. Accordingly, the capacitance C between the wiring line 14 and the ground becomes larger than any of the capacitance between the wiring line 16 and the ground, and the capacitance between the wiring line 26 and the ground.

With the above-mentioned configuration, the capacitance C between the ground and the wiring line 14 connecting the node N and the parallel arm resonator P becomes larger than any of the capacitance between the wiring line 16 and the ground, and the capacitance between the wiring line 26 and the ground in the radio frequency module 200 according to the present example, and therefore, the steepness of the pass band end portion of the radio frequency filter 20 may be increased with a simple configuration as described with reference to FIGS. 2A, 2B and 2C.

[Conclusion]

As described above, the radio frequency module according to the present embodiment further includes the second impedance element disposed in series on the path connecting the terminal 11 and the terminal 12. The node is positioned between the first impedance element and the second impedance element.

Accordingly, including a plurality of impedance elements may achieve radio frequency filters having various pass band characteristics. For example, a high pass filter, a low pass filter, a band pass filter, a notch filter, or the like may easily be achieved as a radio frequency filter.

Further, the capacitance between the first wiring line and the ground is larger than the capacitance between the ground and a third wiring line that connects the second impedance element and the terminal out of the input terminal and the output terminal having the shorter wiring length to the second impedance element, for example.

Accordingly, the steepness of the pass band end portion of the radio frequency filter may further be increased.

Embodiment 3

Next, a radio frequency module according to Embodiment 3 will be described.

The radio frequency module according to the present embodiment is different compared to the radio frequency module according to Embodiment 2 in that a multiplexer including a plurality of radio frequency filters is provided. At least one of the plurality of radio frequency filters is the radio frequency filter 10 according to Embodiment 1 or the radio frequency filter 20 according to Embodiment 2. Hereinafter, the points different from Embodiment 2 will mainly be described, and the description of points in common will be omitted or simplified.

Figure 9:
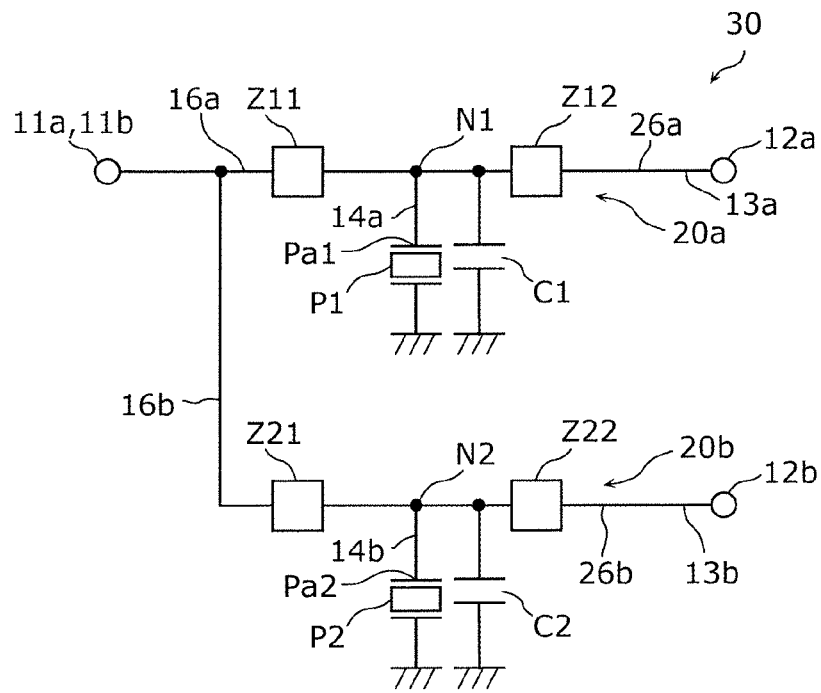
FIG. 9 is a circuit configuration diagram of a multiplexer provided in a radio frequency module according to Embodiment 3.

FIG. 9 is a circuit configuration diagram of a multiplexer 30 provided in the radio frequency module according to the present embodiment. The multiplexer 30 is a diplexer including a radio frequency filter 20a and a radio frequency filter 20b as illustrated in FIG. 9.

The radio frequency filter 20a is an example of a first filter included in a plurality of filters provided in the multiplexer 30. In the present embodiment, the radio frequency filter 20a has the same configuration as that of the radio frequency filter 20 according to Embodiment 2.

Specifically, the radio frequency filter 20a includes a terminal 11a, a terminal 12a, an impedance element Z11, an impedance element Z12, and a parallel arm resonator P1. The terminal 11a, the terminal 12a, the impedance element Z11, the impedance element Z12, and the parallel arm resonator P1 correspond to the terminal 11, the terminal 12, the impedance element Z1, the impedance element Z2, and the parallel arm resonator P of the radio frequency filter 20 according to Embodiment 2, respectively. A path 13a, wiring lines 14a, 16a, and 26a, and a node N1 correspond to the path 13, the wiring lines 14, 16, and 26, and the node N, respectively.

The capacitance C1 between the wiring line 14a and the ground corresponds to the capacitance C between the wiring line 14 and the ground. The capacitance C1 is larger than the capacitance between the wiring line 16a and the ground as with Embodiment 2. In addition, the capacitance C1 may be larger than the capacitance between the wiring line 26a and the ground. Accordingly, the capacitance C1 between the ground and the wiring line 14a connecting the node N1 and the parallel arm resonator P1 increases, and therefore, the steepness of the pass band end portion of the radio frequency filter 20a may be increased with a simple configuration.

The radio frequency filter 20b is an example of a second filter among the plurality of filters included in the multiplexer 30. In the present embodiment, the radio frequency filter 20b has the same configuration as that of the radio frequency filter 20 according to Embodiment 2.

Specifically, the radio frequency filter 20b includes a terminal 11b, a terminal 12b, an impedance element Z21, an impedance element Z22, and a parallel arm resonator P2. The terminal 11b, the terminal 12b, the impedance element Z21, the impedance element Z22, and the parallel arm resonator P2 correspond to the terminal 11, the terminal 12, the impedance element Z1, the impedance element Z2, and the parallel arm resonator P of the radio frequency filter 20 according to Embodiment 2, respectively. A path 13b, wiring lines 14b, 16b, and 26b, and a node N2 correspond to the path 13, the wiring lines 14, 16, and 26, and the node N, respectively.

The capacitance C2 between the wiring line 14b and the ground corresponds to the capacitance C between the wiring line 14 and the ground. The capacitance C2 is larger than the capacitance between the wiring line 16b and the ground as with Embodiment 2. In addition, the capacitance C2 may be larger than the capacitance between the wiring line 26b and the ground. Accordingly, the capacitance C2 between the ground and the wiring line 14b connecting the node N2 and the parallel arm resonator P2 increases, and therefore, the steepness of the pass band end portion of the radio frequency filter 20b may be increased with a simple configuration.

In the present embodiment, the terminal 11a included in the radio frequency filter 20a and the terminal 11b included in the radio frequency filter 20b are commonly connected to each other. That is, the radio frequency filter 20a and the radio frequency filter 20b share the input terminal. Note that the term "commonly connected" means that terminals of the two filters are not only directly connected to each other, but also indirectly connected to each other through another impedance element such as an inductor or a capacitor. Here, the terminals 11a and 11b constitute the common terminal.

With the above-mentioned configuration, it is possible to achieve a radio frequency module provided with the multiplexer 30 including a filter with increased steepness of the pass band end portion.

Hereinafter, a specific example of a radio frequency module provided with the multiplexer 30 according to the present embodiment will be described. Note that the arrangements and shapes of elements, wiring substrates, wiring layers, and vias in the respective examples below are merely examples, and are not limited to the described examples.

Example 1

First, a radio frequency module according to Example 1 will be described with reference to FIG. 10A and FIG. 10B. In the following description, the points different from the example of Embodiment 2 will mainly be described, and the description of points in common will be omitted or simplified.

Figure 10A:
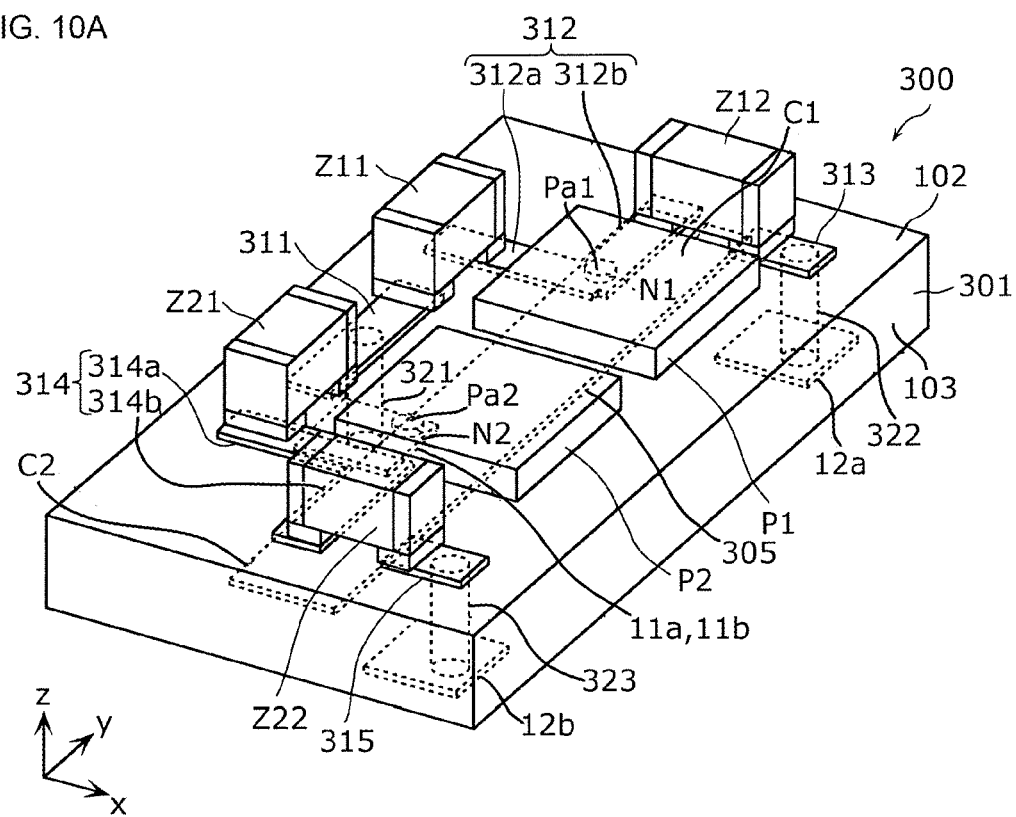
FIG. 10A is a perspective view of a radio frequency module according to Example 1 of Embodiment 3.

FIG. 10A is a perspective view of a radio frequency module 300 according to the present example. FIG. 10B is a three-view drawing of the radio frequency module 300 according to the present example. The portions (a), (b), and (c) of FIG. 10B are a top plan, an elevation, and a right side elevation of the radio frequency module 300, respectively.

Figure 10B:
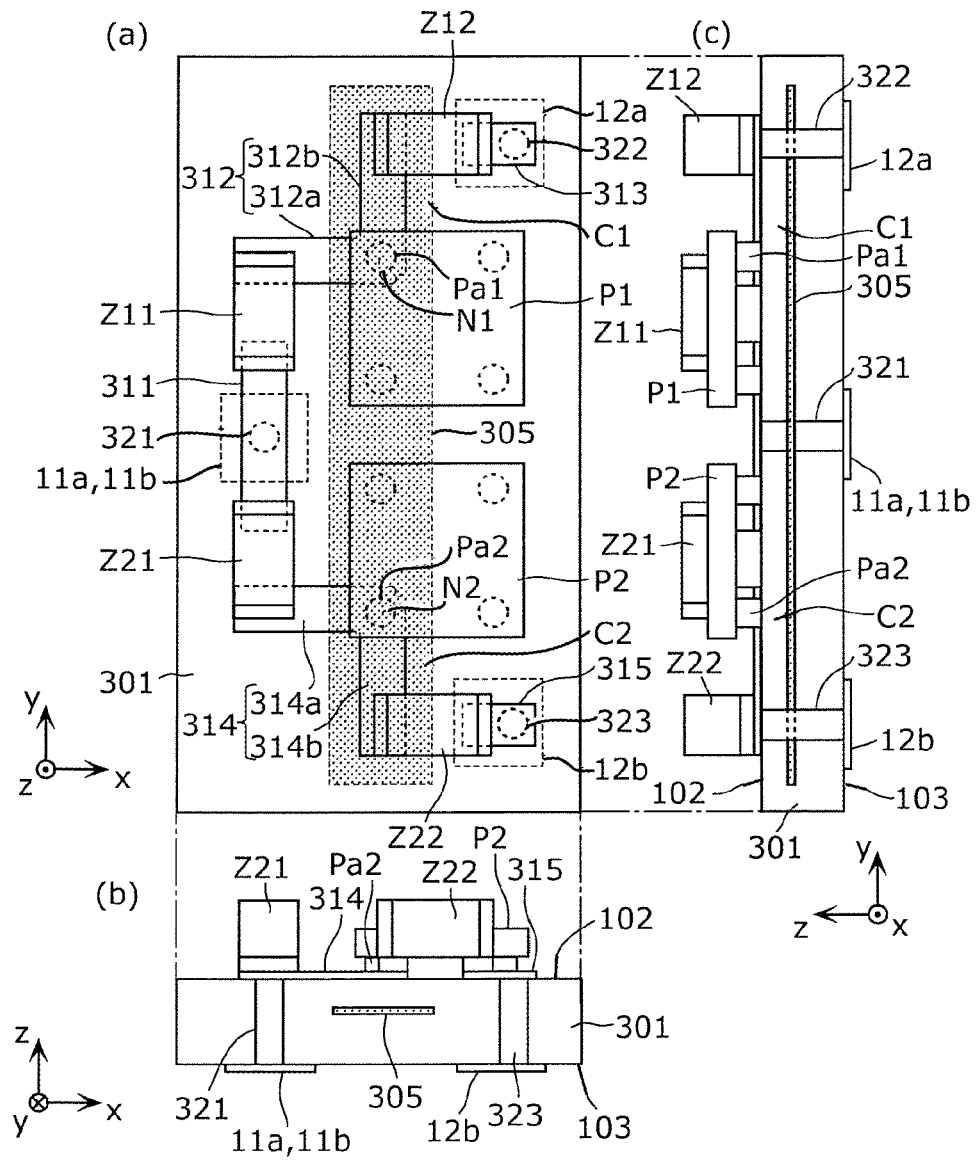
FIG. 10B is a three-view drawing of the radio frequency module according to Example 1 of Embodiment 3.

The radio frequency module 300 includes a wiring substrate 301 and a ground electrode 305 as illustrated in FIG. 10A and FIG. 10B.

The wiring substrate 301 is the same as the wiring substrate 201 according to the example of Embodiment 2 except that the number and the shapes of the wiring layers and the vias included in the wiring substrate 301 are different from those of the wiring substrate 201. The impedance element Z11, the impedance element Z12, the impedance element Z21, the impedance element Z22, the parallel arm resonators P1 and P2 are provided on the front surface 102 of the wiring substrate 301.

The wiring substrate 301 includes a wiring layer 311, a wiring layer 312, a wiring layer 313, a wiring layer 314, a wiring layer 315, a via 321, a via 322, and a via 323 in the present example as illustrated in FIG. 10A and FIG. 10B.

The wiring layers 311, 312, 313, 314, and 315 each are conductive pattern wiring lines provided on the front surface 102 of the wiring substrate 301. The wiring layers 311, 312, 313, 314, and 315 are formed such that a metal thin film of silver (Ag) or copper (Cu) or the like is formed on the front surface 102, and then, the metal thin film is patterned in a predetermined shape, for example. All of the wiring layers 311, 312, 313, 314, and 315 extend in a direction parallel to the front surface 102, that is, in a direction orthogonal to the thickness direction (z-axis direction) of the wiring substrate 301. The widths and the film thicknesses of the wiring layers 311, 312, 313, 314, and 315 are the same as each other, for example, but may be different from each other.

The via 321, the impedance element Z11, and the impedance element Z21 are connected to the wiring layer 311. The wiring layer 311 linearly extends along the y-axis direction from the upper end portion of the via 321 to both one end of the impedance element Z11 and one end of the impedance element Z21 as illustrated in FIG. 10A and (a) of FIG. 10B. The shape of the wiring layer 311 in top view is rectangular, for example, but is not limited thereto.

The impedance element Z11, the parallel arm resonator P1, and the impedance element Z12 are connected to the wiring layer 312. The wiring layer 312 includes a first wiring portion 312a and a second wiring portion 312b as illustrated in FIG. 10A and (a) of FIG. 10B. The connection portion of the first wiring portion 312a and the second wiring portion 312b is a bending point of the wiring layer 312, and corresponds to the node N1.

The impedance element Z11 and the parallel arm resonator P1 are connected to the first wiring portion 312a. The first wiring portion 312a linearly extends along the x-axis direction from the other end of the impedance element Z11 to a terminal Pa1 of the parallel arm resonator P1.

The impedance element Z12 and the parallel arm resonator P1 are connected to the second wiring portion 312b. The second wiring portion 312b linearly extends along the y-axis direction from one end of the impedance element Z12 to the terminal Pa1 of the parallel arm resonator P1.

The first wiring portion 312a and the second wiring portion 312b are vertically connected to each other in top view in the present example. That is, the shape of the wiring layer 312 in top view is an L-shape, for example. The shape of the wiring layer 312 in top view may be a V-shape or a linear shape, for example.

The impedance element Z12 and the via 322 are connected to the wiring layer 313. The wiring layer 313 linearly extends along the x-axis direction from the other end of the impedance element Z12 to the upper end portion of the via 322.

The impedance element Z21, the parallel arm resonator P2, and the impedance element Z22 are connected to the wiring layer 314. The wiring layer 314 includes a first wiring portion 314a and a second wiring portion 314b as illustrated in FIG. 10A and (a) of FIG. 10B. The connection portion of the first wiring portion 314a and the second wiring portion 314b is a branch point of the wiring layer 314, and corresponds to the node N2.

The impedance element Z21 and the parallel arm resonator P2 are connected to the first wiring portion 314a. The first wiring portion 314a linearly extends along the x-axis direction from the other end of the impedance element Z21 to a terminal Pa2 of the parallel arm resonator P2.

The impedance element Z22 and the parallel arm resonator P2 are connected to the second wiring portion 314b. The second wiring portion 314b linearly extends along the y-axis direction from one end of the impedance element Z22 to the terminal Pa2 of the parallel arm resonator P2.

The impedance element Z22 and the via 323 are connected to the wiring layer 315. The wiring layer 315 linearly extends along the x-axis direction from the other end of the impedance element Z22 to the upper end portion of the via 323.

The wiring layers 313 and 315 may not be provided. The via 322 may be positioned in a direction directly below the other end of the impedance element Z12, and may be directly connected to the other end, for example. Similarly, the via 323 may be positioned in a direction directly below the other end of the impedance element Z22, and may be directly connected to the other end.

The vias 321, 322, and 323 are conductive members extending along the thickness direction of the wiring substrate 301. In the present example, the vias 321, 322, and 323 penetrate through the wiring substrate 301 from the front surface 102 to the back surface 103. The vias 321, 322, and 323 are the same as the via 121 of Embodiment 1 in the method of forming, the shape, the size, and the like.

The terminal 11a (that is, terminal 11b) and the wiring layer 311 are connected to the via 321. The via 321 is provided so as to overlap with both the wiring layer 311 and the terminal 11a in top view.

The terminal 12a and the wiring layer 313 are connected to the via 322. The via 322 is provided so as to overlap with both the wiring layer 313 and the terminal 12a in top view.

The terminal 12b and the wiring layer 315 are connected to the via 323. The via 323 is provided so as to overlap with both the wiring layer 315 and the terminal 12b in top view.

The elements, terminals, wiring layers, and vias included in the radio frequency module 300 are arranged in line symmetry as illustrated in (a) of FIG. 10B in the present example. The axis of the line symmetry passes through the center of the via 321 and is an axis parallel to the x-axis direction. Accordingly, the wiring lines and the elements included in the radio frequency filter 20a and the wiring lines and the elements included in the radio frequency filter 20b can be arranged apart from each other, and therefore, the coupling between the wiring lines or the elements or the like of the radio frequency filter 20a and the radio frequency filter 20b may be suppressed.

Here, the correspondence between the wiring structure included in the radio frequency module 300 according to the present example and the wiring line included in the multiplexer 30 illustrated in FIG. 9 will be described.

The path 13a connecting the terminal 11a (terminal 11b) being the common terminal and the terminal 12a is constituted of the via 321, part of the wiring layer 311, the wiring layer 312, the wiring layer 313, and the via 322 in the present example. The path 13a includes the wiring line 16a, the node N1, and the wiring line 26a as illustrated in FIG. 9. The node N1 is a bending point of the wiring layer 312, and corresponds to the connection portion of the first wiring portion 312a and the second wiring portion 312b. The wiring line 14a branched from the path 13a at the node N1 corresponds to the terminal Pa1 of the parallel arm resonator P1. The wiring line 16a included in the path 13a is constituted of the via 321 and part of the wiring layer 311. Specifically, the part of the wiring layer 311 constituting the wiring line 16a is the portion extending from the connection portion of the wiring layer 311 and the via 321 to the connection portion of the wiring layer 311 and one end of the impedance element Z11. Further, the wiring line 26a is constituted of the wiring layer 313 and the via 322.

Similarly, the path 13b connecting the terminal 11b (terminal 11a) being the common terminal and the terminal 12b is constituted of the via 321, part of the wiring layer 311, the wiring layer 314, the wiring layer 315, and the via 323. The path 13b includes the wiring line 16b, the node N2, and the wiring line 26b as illustrated in FIG. 9. The node N2 is a bending point of the wiring layer 314, and corresponds to the connection portion of the first wiring portion 314a and the second wiring portion 314b. The wiring line 14b branched from the path 13b at the node N2 corresponds to the terminal Pa2 of the parallel arm resonator P2. The wiring line 16b included in the path 13b is constituted of the via 321 and part of the wiring layer 311. Specifically, the part of the wiring layer 311 constituting the wiring line 16b is the portion extending from the connection portion of the wiring layer 311 and the via 321 to the connection portion of the wiring layer 311 and one end of the impedance element Z21. Further, the wiring line 26b is constituted of the wiring layer 315 and the via 323.

The ground electrode 305 corresponds to the ground electrode 205 according to the example of Embodiment 2, and has a shape, a size, and an arrangement being different from those of the ground electrode 205. Specifically, the ground electrode 305 has a shape longer than the ground electrode 205 along the y-axis direction as illustrated in FIG. 10A and FIG. 10B. More specifically, the ground electrode 305 overlaps with both the second wiring portion 312b and the second wiring portion 314b in top view.

The ground electrode 305 is continuously provided from the connection portion of the second wiring portion 312b and the impedance element Z12 to the connection portion of the second wiring portion 314b and the impedance element Z22 in top view, for example. The ground electrode 305 is not subject to isolation in the wiring substrate 301, and is constituted of one electrode plate. The ground electrode 305 is positioned in a direction directly below the terminal Pa1 (wiring line 14a) of the parallel arm resonator P1, and in a direction directly below the terminal Pa2 (wiring line 14b) of the parallel arm resonator P2. The ground electrode 305 functions as a ground electrode common to the capacitance C1 and the capacitance C2, where the capacitance C1 is generated in the wiring line 14a of the radio frequency filter 20a and the capacitance C2 is generated in the wiring line 14b of the radio frequency filter 20b.

The ground electrode 305 is provided at a position closer to the front surface 102 than the back surface 103 in the thickness direction of the wiring substrate 301, for example. As the distance between the ground electrode 305 and the wiring layers 312 and 314 is shorter, the capacitance C1 and C2 may be made larger. For example, the ground electrode 305 is provided at a position where the distance to the terminal Pa1 constituting the wiring line 14a is shorter than the distance to the wiring layer 311 included in the wiring line 16a, for example.

The ground electrode 305 does not overlap with the wiring layers 311, 313, and 315 when viewed in top view. The ground electrode 305 is provided at a position where the distances (distances in x-axis direction) from the vias 321, 322, and 323 are equal to each other, for example. Specifically, the ground electrode 305 is positioned in the center of the wiring substrate 301 in the x-axis direction. In addition, the ground electrode 305 does not overlap with any of the terminals 11a (terminal 11b), 12a, and 12b in top view.

In the present example, the respective wiring layers and the respective vias have symmetrical shapes and are symmetrically arranged with the line, which passes through the terminal 11a (that is, terminal 11b) being the common input terminal and the via 321, as the symmetrical axis. The ground electrode 305 has a shape of line symmetry and is symmetrically arranged with the same symmetrical axis.

With the above-mentioned configuration, the capacitance C1 between the ground and the wiring line 14a connecting the node N1 and the parallel arm resonator P1 becomes larger than any of the capacitance between the wiring line 16a and the ground, and the capacitance between the wiring line 26a and the ground in the radio frequency module 300 according to the present example, and therefore, the steepness of the pass band end portion of the radio frequency filter 20a may be increased with a simple configuration as described with reference to FIGS. 2A, 2B and 2C. Similarly, the steepness of the pass band end portion of the radio frequency filter 20b may be increased with a simple configuration. Thus, it is possible to achieve the radio frequency module 300 provided with the multiplexer including the radio frequency filters 20a and 20b with increased steepness of the pass band end portion of the filter.

Example 2

Next, a radio frequency module according to Example 2 will be described with reference to FIG. 11A and FIG. 11B. The radio frequency module according to the present example is different compared to the radio frequency module according to Example 1 in that the impedance elements Z11, Z12, Z21, and Z22, and the wiring structure are provided in the wiring substrate. In the following description, the points different from Example 1 will mainly be described, and the description of points in common will be omitted or simplified.

Figure 11A:
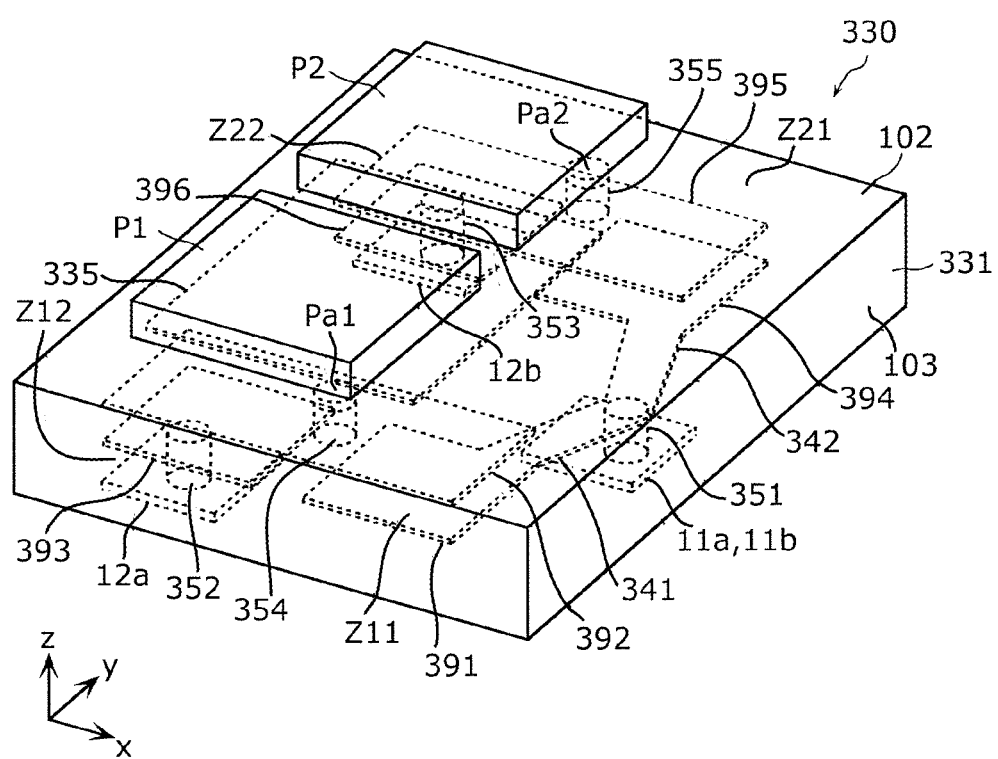
FIG. 11A is a perspective view of a radio frequency module according to Example 2 of Embodiment 3.

FIG. 11A is a perspective view of a radio frequency module 330 according to the present example. FIG. 11B is a three-view drawing of the radio frequency module 330 according to the present example. The portions (a), (b), and (c) of FIG. 11B are a top plan, an elevation, and a right side elevation of the radio frequency module 330, respectively.

Figure 11B:
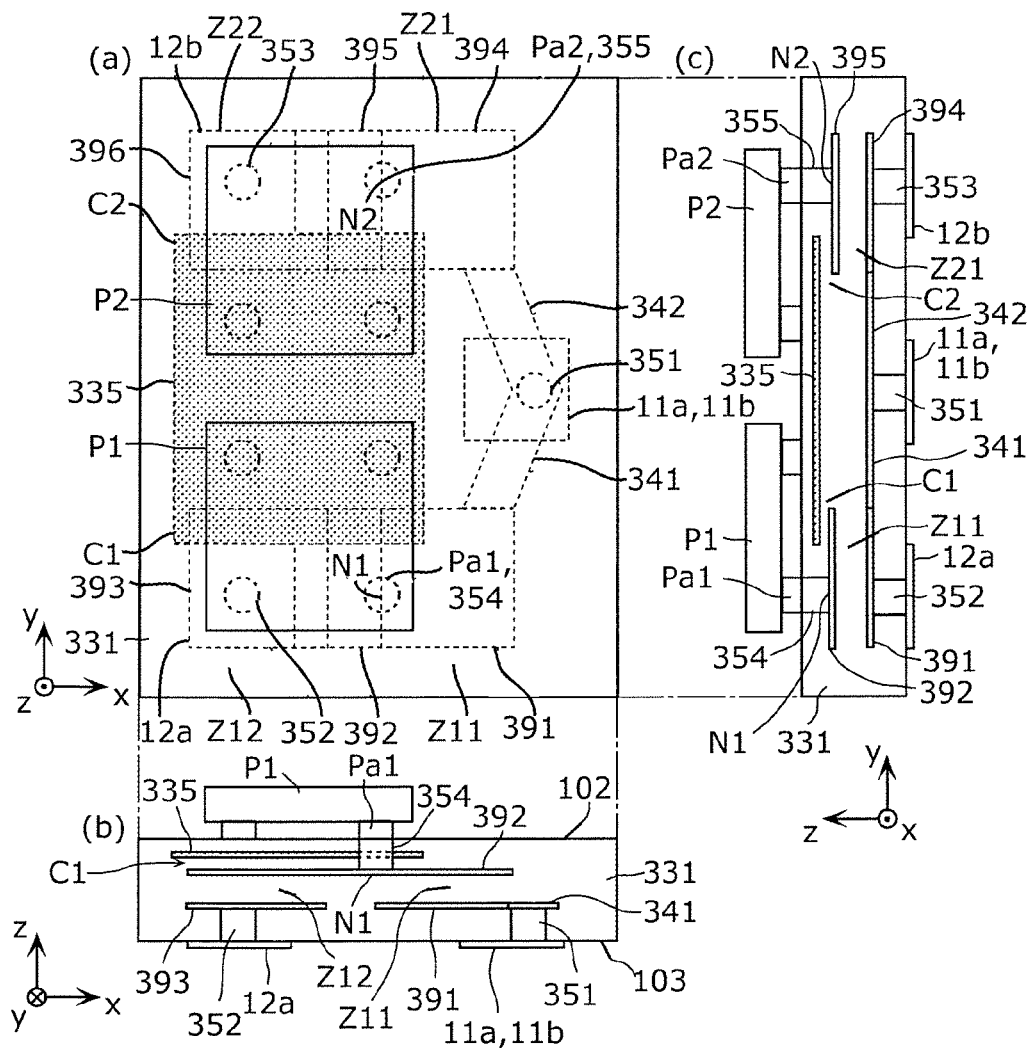
FIG. 11B is a three-view drawing of the radio frequency module according to Example 2 of Embodiment 3.

The radio frequency module 330 includes a wiring substrate 331 and a ground electrode 335 as illustrated in FIG. 11A and FIG. 11B.

The wiring substrate 331 is the same as the wiring substrate 301 excluding the following: the number and the shapes of the wiring layers and the vias included in the wiring substrate 331 are different from those of the wiring substrate 301; the impedance elements Z11, Z12, Z21, and Z22 are provided in the wiring substrate 331. The wiring substrate 331 includes a wiring layer 341, a wiring layer 342, a via 351, a via 352, a via 353, a via 354, and a via 355 in the present example as illustrated in FIG. 11A and FIG. 11B.

The impedance elements Z11, Z12, Z21, and Z22 are all capacitors in the present example. The impedance element Z11 includes an electrode plate 391 and an electrode plate 392. The impedance element Z12 includes the electrode plate 392 and an electrode plate 393.

The impedance element Z11 and the impedance element Z12 share the electrode plate 392. The impedance element Z11 is formed of the electrode plate 391 and the portion of the electrode plate 392 overlapping with the electrode plate 391 in top view. Further, the impedance element Z12 is formed of the electrode plate 393 and the portion of the electrode plate 392 overlapping with the electrode plate 393. The electrode plate 392 and each of the electrode plates 391 and 393 are disposed so as to face each other with a predetermined distance therebetween, for example. The electrode plates 391 and 393 are positioned in the same layer in the wiring substrate 331, for example. The electrode plate 391 and the electrode plate 393 are isolated from each other, and are not connected to each other. Note that the electrode plate 391 and the electrode plate 393 may be positioned in different layers.

Each of the electrode plate 391 and the electrode plate 392 corresponds to the terminal of the impedance element Z11, and also functions as part of a wiring line. Each of the electrode plate 392 and the electrode plate 393 corresponds to the terminal of the impedance element Z12, and also functions as part of a wiring line.

The impedance element Z21 includes an electrode plate 394 and an electrode plate 395. The impedance element Z22 includes the electrode plate 395 and an electrode plate 396.

The impedance element Z21 and the impedance element Z22 share the electrode plate 395. The impedance element Z21 is formed of the electrode plate 394 and the portion of the electrode plate 395 overlapping with the electrode plate 394 in top view. Further, the impedance element Z22 is formed of the electrode plate 396 and the portion of the electrode plate 395 overlapping with the electrode plate 396. The electrode plate 395 and each of the electrode plates 394 and 396 are disposed so as to face each other with a predetermined distance therebetween, for example. The electrode plates 394 and 396 are positioned in the same layer in the wiring substrate 331, for example. The electrode plate 394 and the electrode plate 396 are isolated from each other, and are not connected to each other. Note that the electrode plate 394 and the electrode plate 396 may be positioned in different layers.

Each of the electrode plates 394 and 395 corresponds to the terminal of the impedance element Z21, and also functions as part of a wiring line. Each of the electrode plates 395 and 396 corresponds to the terminal of the impedance element Z22, and also functions as part of a wiring line.

Note that the portion of the electrode plate 392 not overlapping with any of the electrode plates 391 and 393 may be shorter than the width of each of the electrode plates 391 and 393, and may have the same width as that of the wiring layer 341, for example. The portion of the electrode plate 395 not overlapping with any of the electrode plates 394 and 396 may be shorter than the width of each of the electrode plates 394 and 396, and may have the same width as that of the wiring layer 342, for example.

The electrode plates 392 and 395 are provided at positions closer to the front surface 102 than the back surface 103 in the thickness direction of the wiring substrate 331 in the present example. The distance between the front surface 102 and each of the electrode plates 392 and 395, that is, the length of each of the vias 354 and 355 is shorter than the distance between the back surface 103 and each of the electrode plates 391, 393, 394, and 396, that is, the length of each of the vias 351, 352, and 353, for example. Alternatively, the electrode plates 392 and 395 may be provided at positions closer to the back surface 103 than the front surface 102 in the thickness direction of the wiring substrate 331.

The wiring layers 341 and 342 each are conductive pattern wiring lines provided in the wiring substrate 331. The wiring layers 341 and 342 are formed such that a metal thin film of silver (Ag) or copper (Cu) or the like is formed while constructing the lamination structure of the wiring substrate 331, and then, the metal thin film is patterned in a predetermined shape, for example.

The via 351 and the impedance element Z11 are connected to the wiring layer 341. The wiring layer 341 linearly extends from the upper end portion of the via 351 to the electrode plate 391 of the impedance element Z11 as illustrated in FIG. 11A and (a) of FIG. 11B. The shape of the wiring layer 341 in top view is a parallelogram, for example, but is not limited thereto.

The via 351 and the impedance element Z21 are connected to the wiring layer 342. The wiring layer 342 linearly extends from the upper end portion of the via 351 to the electrode plate 394 of the impedance element Z21 as illustrated in FIG. 11A and (a) of FIG. 11B. The shape of the wiring layer 342 in top view is a parallelogram, for example, but is not limited thereto.

The vias 351, 352, 353, and 354, and the via 355 are conductive members extending along the thickness direction of the wiring substrate 331. The vias 351, 352, and 353 are embedded in recesses that are recessed from the back surface 103 toward the front surface 102 of the wiring substrate 331 in the present example. The vias 354 and 355 are embedded in recesses that are recessed from the front surface 102 toward the back surface 103 of the wiring substrate 331. That is, the vias 351, 352, 353, 354, and 355 do not penetrate through the wiring substrate 331. The vias 351, 352, and 353 are the same as the via 171 according to Example 3 of Embodiment 1 in the method of forming, the shape, the size, and the like, for example. The vias 354 and 355 are the same as the via 173 according to Example 3 of Embodiment 1 in the method of forming, the shape, the size, and the like, for example.

The terminal 11a (terminal 11b) and the wiring layers 341 and 342 are connected to the via 351. The via 351 is provided so as to overlap with both the wiring layers 341 and 342 and the terminal 11a in top view.

The terminal 12a and the electrode plate 393 are connected to the via 352. The via 352 is provided so as to overlap with both the electrode plate 393 and the terminal 12a in top view.

The terminal 12b and the electrode plate 396 are connected to the via 353. The via 353 is provided so as to overlap with both the electrode plate 396 and the terminal 12b in top view.

The elements, terminals, wiring layers, and vias included in the radio frequency module 330 are arranged in line symmetry as illustrated in (a) of FIG. 11B in the present example. The axis of the line symmetry passes through the center of the via 351 and is an axis parallel to the x-axis direction. Accordingly, the coupling such as between the wiring lines or the elements in the radio frequency filter 20a and the radio frequency filter 20b may be suppressed.

Here, the correspondence between the wiring structure included in the radio frequency module 330 according to the present example and the wiring line included in the multiplexer 30 illustrated in FIG. 9 will be described.

The path 13a connecting the terminal 11a (terminal 11b) being the common terminal and the terminal 12a is constituted of the via 351, the wiring layer 341, the electrode plate 391, the electrode plate 392, the electrode plate 393, and the via 352. The node N1 corresponds to the connection portion of the electrode plate 392 and the via 354. Further, the wiring line 14a branched from the path 13a at the node N1 is constituted of the via 354. The wiring line 16a included in the path 13a is constituted of the via 351 and the wiring layer 341. The wiring line 26a is constituted of the via 352.

Note that the electrode plate 392 corresponds to the wiring line connecting the impedance element Z11 and the impedance element Z12. That is, the electrode plate 392 corresponds to the wiring line connecting the impedance element Z11 and the node N1, and the wiring line connecting the impedance element Z12 and the node N1. Similarly, the electrode plate 395 corresponds to the wiring line connecting the impedance element Z21 and the impedance element Z22. That is, the electrode plate 395 corresponds to the wiring line connecting the impedance element Z21 and the node N2, and the wiring line connecting the impedance element Z22 and the node N2.

The ground electrode 335 corresponds to the ground electrode 305 according to Example 1, and has a shape, a size, and an arrangement being different from those of the ground electrode 305. Specifically, the ground electrode 335 is provided in the wiring substrate 331, and is positioned between the front surface 102 and the electrode plates 392 and 395 in the thickness direction of the wiring substrate 331 as illustrated in FIG. 11A and FIG. 11B.

Specifically, the ground electrode 335 is provided at a position overlapping with the electrode plate 392 in top view. That is, the ground electrode 335 overlaps with each of the impedance elements Z11 and Z12 in top view. Further, the ground electrode 335 is provided at a position overlapping with the electrode plate 395 in top view. That is, the ground electrode 335 overlaps with each of the impedance elements Z21 and Z22 in top view. Part of the ground electrode 335 overlaps with part of the electrode plate 392 and part of the electrode plate 395 in top view, for example. The shape of the ground electrode 335 in top view is rectangular, for example, but is not limited thereto.

The ground electrode 335 is continuously provided from part of the electrode plate 392 to part of the electrode plate 395 in top view, for example. The ground electrode 335 is not subject to isolation in the wiring substrate 331, and is constituted of one electrode plate. The ground electrode 335 functions as a ground electrode common to the capacitance C1 and the capacitance C2, where the capacitance C1 is generated in the wiring line 14a of the radio frequency filter 20a and the capacitance C2 is generated in the wiring line 14b of the radio frequency filter 20b.

According to the configuration above, the capacitance C1 is generated between the ground electrode 335 and the electrode plate 392. Similarly, the capacitance C2 is generated between the ground electrode 335 and the electrode plate 395. Note that, the ground electrode 335 does not overlap with the via 351, the wiring layers 341 and 342 included in the wiring lines 16a and 16b in top view as illustrated in (a) of FIG. 11B. Further, the ground electrode 335 overlaps with the electrode plates 391, 393, 394, and 396, but as illustrated in (c) of FIG. 11B, the electrode plate 392 or 395 is provided between the ground electrode 335 and the electrode plates 391, 393, 394, and 396. With this, the capacitance generated between the ground electrode 335 and each of the wiring lines 16a, 16b, 26a, and 26b may be reduced.

With the above-mentioned configuration, the capacitance C1 between the ground and the wiring line 14a connecting the node N1 and the parallel arm resonator P1 becomes larger than any of the capacitance between the wiring line 16a and the ground, and the capacitance between the wiring line 26a and the ground in the radio frequency module 330 according to the present example, and therefore, the steepness of the pass band end portion of the radio frequency filter 20a may be increased with a simple configuration as described with reference to FIGS. 2A, 2B and 2C. Similarly, the steepness of the pass band end portion of the radio frequency filter 20b may be increased with a simple configuration. Thus, it is possible to achieve the radio frequency module 330 provided with the multiplexer including the radio frequency filters 20a and 20b with increased steepness of the pass band end portion of the filter.

[Conclusion]

As described above, the radio frequency module according to the present embodiment is provided with a multiplexer including a plurality of filters including a first filter being the above-mentioned radio frequency filter.

Accordingly, it is possible to achieve a radio frequency module provided with a multiplexer including a radio frequency filter in which deterioration of the filter characteristic is suppressed.

The plurality of filters further includes a second filter being the above-mentioned radio frequency filter, and the multiplexer includes a common terminal in which the input terminal or the output terminal of the first filter and the input terminal or the output terminal of the second filter are commonly connected to each other, for example.

Accordingly, it is possible to achieve a radio frequency module provided with a multiplexer including a plurality of radio frequency filters in which the deterioration of the filter characteristic is suppressed.

Note that, an example in which both the radio frequency filter 20a and the radio frequency filter 20b are the radio frequency filter 20 according to Embodiment 2 has been described in the present embodiment. However, at least one of the radio frequency filter 20a and the radio frequency filter 20b may be the radio frequency filter 10 according to Embodiment 1. Further, only one of the radio frequency filter 20a and the radio frequency filter 20b may be the radio frequency filter 10 or the radio frequency filter 20, for example.

Further, a plurality of frequency bands each corresponding to the plurality of filters may be a band of long term evolution (LTE) of 4G, or may be a band of new radio (NR) of 5G, for example. Bands of NR may include sub 6 GHz band (n77 (3.3-4.2 GHz), n78 (3.3-3.8 GHz), n79 (4.4-5.0 GHz), and 5.0-7.125 GHz), for example. Further, the plurality of frequency bands may be L5 of global positioning system (GPS), for example. Further, the plurality of frequency bands may include a 5 GHz band of Wi-Fi (registered trademark), for example. The 5 GHz band may be 5150-5725 MHz, for example. The first filter and the second filter may be a filter including any of the above frequency bands in the pass band thereof, for example.

The plurality of filters may include at least two filters out of the following filters as the first filter and the second filter, for example; a filter having a pass band including 699 MHz to 960 MHz, a filter having a pass band including 1.2 GHz, a filter having a pass band including 1.4 GHz to 5 GHz, and a filter having a pass band including 5 GHz to 7.125 GHz.

The plurality of filters may include at least two filters out of the following filters as the first filter and the second filter, for example; a filter having a pass band including 699 MHz to 2.7 GHz, a filter having a pass band including 3.3 GHz to 5 GHz, and a filter having a pass band including 5 GHz to 7.125 GHz.

The plurality of filters may include at least two filters out of the following filters as the first filter and the second filter, for example; a filter having a pass band including 699 MHz to 2.7 GHz, a filter having a pass band including 3.3 GHz to 4.2 GHz, a filter having a pass band including 4.4 GHz to 5 GHz, and a filter having a pass band including 5 GHz to 7.125 GHz.

Embodiment 4

Next, a radio frequency module according to Embodiment 4 will be described.

The radio frequency module according to the present embodiment is different compared to the radio frequency module according to Embodiment 3 in that acoustic wave resonators included in two radio frequency filters each are packaged in one package. Hereinafter, the points different from Embodiment 3 will mainly be described, and the description of points in common will be omitted or simplified.

Figure 12:
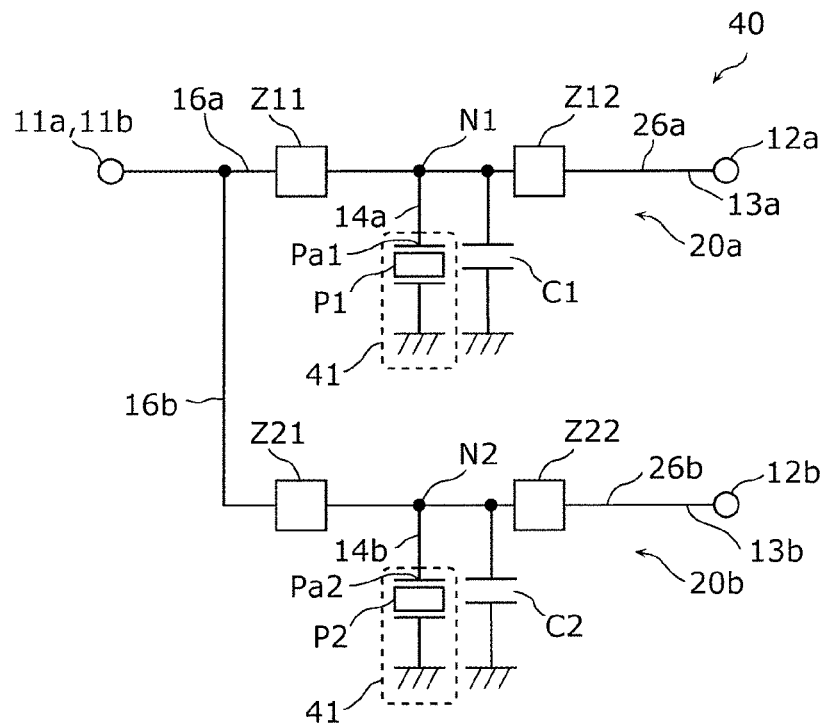
FIG. 12 is a circuit configuration diagram of a multiplexer provided in a radio frequency module according to Embodiment 4.

FIG. 12 is a circuit configuration diagram of a multiplexer 40 provided in the radio frequency module according to the present embodiment. The parallel arm resonator P1 of the radio frequency filter 20a and the parallel arm resonator P2 of the radio frequency filter 20b are housed in one package 41 as illustrated in FIG. 12. Note that, in FIG. 12, the dashed line frames respectively surrounding the parallel arm resonator P1 and the parallel arm resonator P2 represent the one package 41. Housing the parallel arm resonators P1 and P2 in the one package 41 makes it possible to reduce the multiplexer 40 in size, for example.

The ground electrodes for generating the capacitance C1 and the capacitance C2 are isolated in the wiring substrate in the present embodiment. Specifically, the radio frequency module according to the present embodiment includes a first ground electrode overlapping with the wiring line 14a of the radio frequency filter 20a, and a second ground electrode overlapping with the wiring line 14b of the radio frequency filter 20b. The first ground electrode and the second ground electrode are electrically isolated from each other in the wiring substrate.

With the configuration above, the isolation between the radio frequency filter 20a and the radio frequency filter 20b may be ensured in the multiplexer 40 of the radio frequency module according to the present embodiment. In addition, the steepness of the pass band end portion of each of the filters of the radio frequency filters 20a and 20b may be increased since the radio frequency module according to the present embodiment has the same relationship in the capacitance as that of Embodiment 3.

Hereinafter, a specific example of a radio frequency module provided with the multiplexer 40 according to the present embodiment will be described. Note that the arrangements and shapes of elements, wiring substrates, wiring layers, and vias in the respective examples below are merely examples, and are not limited to the described examples.

EXAMPLE

A radio frequency module according to an example of the present embodiment will be described with reference to FIG. 13A and FIG. 13B. Hereinafter, the points different from Example 1 or 2 of Embodiment 3 will mainly be described, and the description of points in common will be omitted or simplified.

Figure 13A:
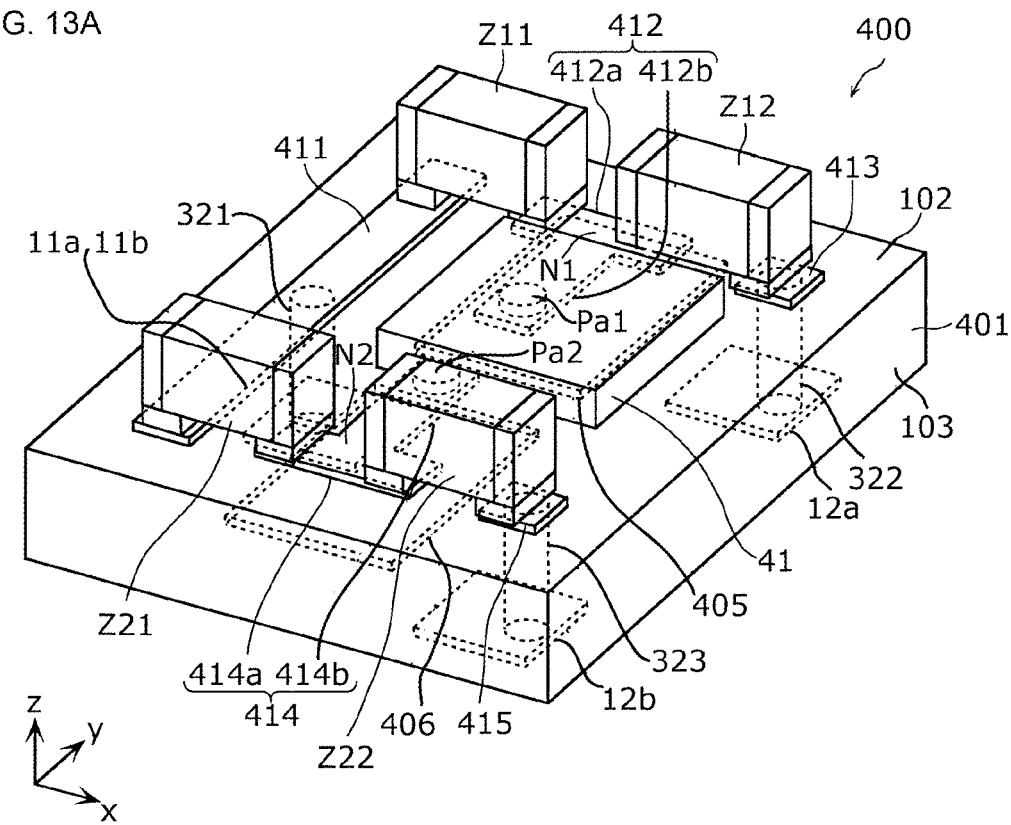
FIG. 13A is a perspective view of a radio frequency module according to an example of Embodiment 4.

FIG. 13A is a perspective view of a radio frequency module 400 according to the present example. FIG. 13B is a three-view drawing of the radio frequency module 400 according to the present example. The portions (a), (b), and (c) of FIG. 13B are a top plan, an elevation, and a right side elevation of the radio frequency module 400, respectively.

Figure 13B:
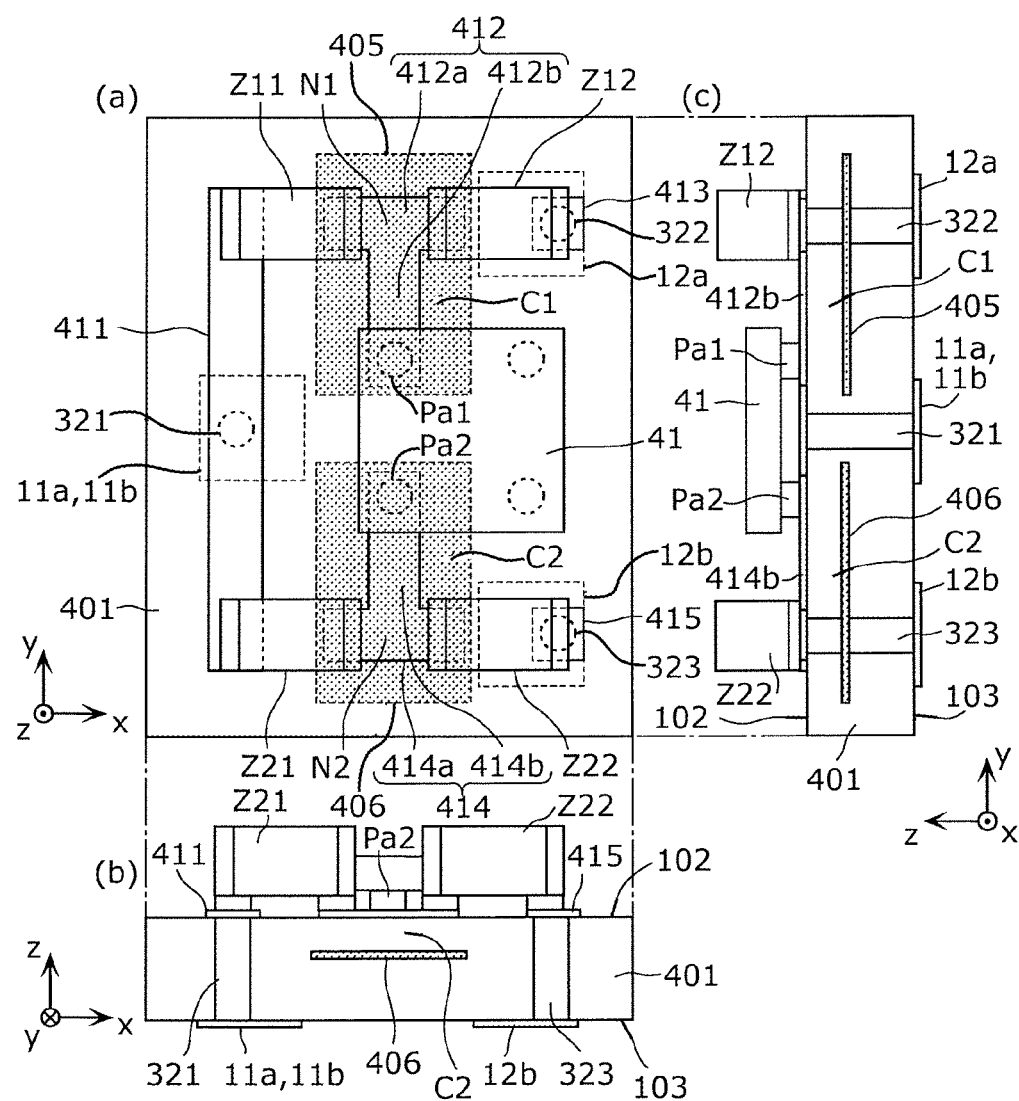
FIG. 13B is a three-view drawing of the radio frequency module according to the example of Embodiment 4.

The radio frequency module 400 includes a wiring substrate 401 and ground electrodes 405 and 406 as illustrated in FIG. 13A and FIG. 13B.

The wiring substrate 401 is the same as the wiring substrate 301 according to Example 1 of Embodiment 3 except that the number and the shapes of the wiring layers and the vias included in the wiring substrate 401 are different from those of the wiring substrate 301. The wiring substrate 401 includes a wiring layer 411, a wiring layer 412, a wiring layer 413, a wiring layer 414, a wiring layer 415, the via 321, the via 322, and the via 323. The vias 321, 322, and 323 are the same as those in Example 1 of Embodiment 3.

The wiring layers 411, 412, 413, 414, and 415 are similar to the wiring layers 311, 312, 313, 314, and 315 included in the wiring substrate 301 according to Example 1 of Embodiment 3, and at least one of the shape and the arrangement is different. The front surface 102 of the wiring substrate 401 is provided with the impedance elements Z11, Z12, Z21, and Z22 and the package 41 housing the parallel arm resonators P1 and P2.

The shape of the wiring layer 412 in top view is a T-shape in the present example, for example. Specifically, the wiring layer 412 includes a first wiring portion 412a and a second wiring portion 412b. The connection portion of the first wiring portion 412a and the second wiring portion 412b is a branch point of the wiring layer 412, and corresponds to the node N1.

The impedance element Z11 and the impedance element Z12 are connected to the first wiring portion 412a. Specifically, the first wiring portion 412a extends along the x-axis direction from one end of the impedance element Z11 to one end of the impedance element Z12.

The parallel arm resonator P1 is connected to the second wiring portion 412b. Specifically, the second wiring portion 412b linearly extends along the y-axis direction from the first wiring portion 412a to the terminal Pa1 of the parallel arm resonator P1.

The shape of the wiring layer 414 in top view is a T-shape as with the wiring layer 412. Specifically, the wiring layer 414 includes a first wiring portion 414a and a second wiring portion 414b. The connection portion of the first wiring portion 414a and the second wiring portion 414b is a branch point of the wiring layer 414, and corresponds to the node N2.

The impedance element Z21 and the impedance element Z22 are connected to the first wiring portion 414a. Specifically, the first wiring portion 414a extends along the x-axis direction from one end of the impedance element Z21 to one end of the impedance element Z22.

The parallel arm resonator P2 is connected to the second wiring portion 414b. Specifically, the second wiring portion 414b linearly extends along the y-axis direction from the first wiring portion 414a to the terminal Pa2 of the parallel arm resonator P2.

Here, the correspondence between the wiring structure included in the radio frequency module 400 according to the present example and the wiring line included in the multiplexer 40 illustrated in FIG. 12 will be described.

The path 13a connecting the terminal 11a (terminal 11b) being the common terminal and the terminal 12a is constituted of the via 321, part of the wiring layer 411, the first wiring portion 412a of the wiring layer 412, the wiring layer 413, and the via 322 in the present example. The node N1 is a branch point of the wiring layer 412, and corresponds to the connection portion of the first wiring portion 412a and the second wiring portion 412b. The wiring line 14a branched from the path 13a at the node N1 is constituted of the second wiring portion 412b. The wiring line 16a included in the path 13a is constituted of the via 321 and part of the wiring layer 411. Specifically, the part of the wiring layer 411 constituting the wiring line 16a is the portion extending from the connection portion of the wiring layer 411 and the via 321 to the connection portion of the wiring layer 411 and one end of the impedance element Z11. Further, the wiring line 26a is constituted of the wiring layer 413 and the via 322.

Similarly, the path 13b connecting the terminal 11a (terminal 11b) being the common terminal and the terminal 12b is constituted of the via 321, part of the wiring layer 411, the first wiring portion 414a of the wiring layer 414, the wiring layer 415, and the via 323. The node N2 is a branch point of the wiring layer 414, and corresponds to the connection portion of the first wiring portion 414a and the second wiring portion 414b. The wiring line 14b branched from the path 13b at the node N2 is constituted of the second wiring portion 414b. The wiring line 16b included in the path 13b is constituted of the via 321 and part of the wiring layer 411.

Specifically, the part of the wiring layer 411 constituting the wiring line 16b is the portion extending from the connection portion of the wiring layer 411 and the via 321 to the connection portion of the wiring layer 411 and one end of the impedance element Z21. Further, the wiring line 26b is constituted of the wiring layer 415 and the via 323.

The ground electrode 405 is an example of a first ground electrode overlapping with the wiring line 14a of the radio frequency filter 20a when the front surface 102 is viewed in plan view. Specifically, the ground electrode 405 overlaps with the second wiring portion 412b constituting the wiring line 14a in top view as illustrated in (a) of FIG. 13B. More specifically, the ground electrode 405 overlaps with the wiring layer 412 in top view. The ground electrode 405 is larger than the wiring layer 412, and the entire wiring layer 412 is positioned inside the ground electrode 405 in top view, for example. The ground electrode 405 does not overlap with any of the wiring layers 411, 413, 414, and 415 in top view in the present example.

The ground electrode 406 is an example of a second ground electrode overlapping with the wiring line 14b of the radio frequency filter 20b when the front surface 102 is viewed in plan view. Specifically, the ground electrode 406 overlaps with the second wiring portion 414b constituting the wiring line 14b in top view as illustrated in (a) of FIG. 13B. More specifically, the ground electrode 406 overlaps with the wiring layer 414 in top view. The ground electrode 406 is larger than the wiring layer 414, and the entire wiring layer 414 is positioned inside the ground electrode 406 in top view, for example. The ground electrode 406 does not overlap with any of the wiring layers 411, 412, 413, and 415 in top view in the present example.

The ground electrodes 405 and 406 are electrically isolated from each other in the wiring substrate 401 as illustrated in (a) and (c) of FIG. 13B. The ground electrode 405 and the ground electrode 406 are positioned in the same layer in the wiring substrate 401 in the thickness direction of the wiring substrate 401, for example. At this time, the ground electrode 405 and the ground electrode 406 are arranged apart from each other with a predetermined distance or more. The ground electrode 405 and the ground electrode 406 are arranged apart from each other with a distance longer than the diameter of the via 321 in top view, for example. Note that the ground electrode 405 and the ground electrode 406 may be provided in different layers in the wiring substrate 401.

The ground electrodes 405 and 406 each are connected to the ground. The ground electrodes 405 and 406 each are connected to the ground provided on the back surface 103 of the wiring substrate 401 by using such as vias (not illustrated), for example. The ground provided on the back surface 103 may be common to the ground electrodes 405 and 406. That is, although the ground electrode 405 and the ground electrode 406 are physically and electrically isolated from each other in the wiring substrate 401, they may be electrically connected to each other at the outside of the wiring substrate 401.

The elements, terminals, wiring layers, vias, and ground electrodes included in the radio frequency module 400 are arranged in line symmetry as illustrated in (a) of FIG. 13B in the present example. The axis of the line symmetry passes through the center of the via 321 and is an axis parallel to the x-axis direction. The impedance elements Z11 and Z12 included in the radio frequency filter 20a and the ground electrode 405 are disposed in a first region out of two divided regions with the axis of the line symmetry as the boundary. The impedance elements Z21 and Z22 included in the radio frequency filter 20b and the ground electrode 406 are disposed in the second region out of the two divided regions with the axis of the line symmetry as the boundary.

Both ends of the impedance element Z11, both ends of the impedance element Z12, and the via 322 are provided side by side on a straight line along the x-axis direction as illustrated in (a) of FIG. 13B, for example. Similarly, both ends of the impedance element Z21, both ends of the impedance element Z22, and the via 323 are provided side by side on a straight line along the x-axis direction.

As described above, the impedance elements Z11 and Z12 included in the radio frequency filter 20a and the impedance elements Z21 and Z22 included in the radio frequency filter 20b are arranged apart from each other in the present example. Further, the ground electrode 405 and the ground electrode 406 are electrically isolated from each other in the wiring substrate 401. Accordingly, it is possible to suppress the coupling between the filters, and the isolation may be ensured.

Also, in the present example, the capacitance C1 between the ground and the wiring line 14a connecting the node N1 and the parallel arm resonator P1 becomes larger than any of the capacitance between the wiring line 16a and the ground, and the capacitance between the wiring line 26a and the ground, and therefore, the steepness of the pass band end portion of the radio frequency filter 20a may be increased with a simple configuration as described with reference to FIGS. 2A, 2B and 2C. Similarly, the steepness of the pass band end portion of the radio frequency filter 20b may be increased with a simple configuration.

[Conclusion]

As described above, the acoustic wave resonator included in the first filter and the acoustic wave resonator included in the second filter are packaged in one package in the radio frequency module according to the present embodiment.

Accordingly, since the multiplexer may be reduced in size, the radio frequency module may also be reduced in size.

Further, the radio frequency module according to the present embodiment includes a first ground electrode and a second ground electrode, where the first ground electrode is connected to the ground and overlaps with the first wiring line of the first filter when viewed from one direction, and the second ground electrode is connected to the ground and overlaps with the first wiring line of the second filter when viewed from the above-mentioned one direction, for example. The first ground electrode and the second ground electrode are electrically isolated from each other in the wiring substrate.

Accordingly, it is possible to suppress the coupling between the radio frequency filters, and the isolation may be ensured.

Note that, an example in which all of the impedance elements included in the multiplexer 40 are provided on the front surface 102 of the wiring substrate 401 has been described in the present embodiment. However, at least one impedance element may be provided in the wiring substrate 401.

In addition, an example in which two acoustic wave resonators are packaged in one package has been described in the present embodiment. However, three or more acoustic wave resonators may be packaged in one package. The radio frequency module may include three or more radio frequency filters, and three or more acoustic wave resonators included in the three or more radio frequency filters may be packaged in one package, for example.

Embodiment 5

Next, a radio frequency module according to Embodiment 5 will be described.

The radio frequency module according to the present embodiment is different from the radio frequency module according to Embodiment 3 in that the impedance elements Z11, Z12, Z21, and Z22 of the multiplexer 30 according to Embodiment 3 are replaced by capacitors, and further, four inductors are provided. Hereinafter, the points different from Embodiment 3 will mainly be described, and the description of points in common will be omitted or simplified.

Figure 14:
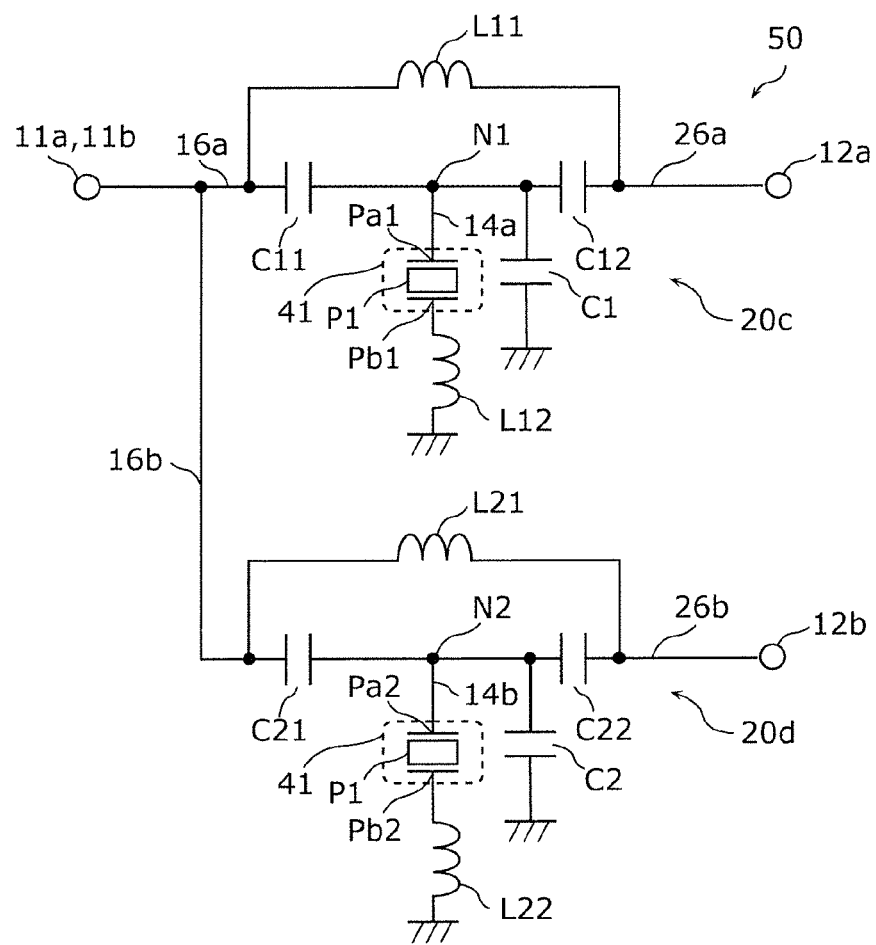
FIG. 14 is a circuit configuration diagram of a multiplexer provided in a radio frequency module according to Embodiment 5.

FIG. 14 is a circuit configuration diagram of a multiplexer 50 provided in the radio frequency module according to the present embodiment. The multiplexer 50 is a diplexer including a radio frequency filter 20c and a radio frequency filter 20d as illustrated in FIG. 14.

The radio frequency filter 20c is an example of a first filter included in a plurality of filters included in the multiplexer 50. Specifically, the radio frequency filter 20c includes the terminal 11a, the terminal 12a, a capacitor C11, a capacitor C12, an inductor L11, an inductor L12, and the parallel arm resonator P1.

The capacitor C11 is an example of the first impedance element disposed in series on the path 13a connecting the terminal 11a and the terminal 12a. The capacitor C12 is an example of the second impedance element disposed in series on the path 13a connecting the terminal 11a and the terminal 12a. The node N1 is positioned between the capacitor C11 and the capacitor C12.

The inductor L11 is an example of a third impedance element connected in parallel to the series circuit of the first impedance element and the second impedance element. Specifically, the inductor L11 is connected in parallel to the series circuit of the capacitors C11 and C12. More specifically, one end of the inductor L11 is connected to the wiring line connecting the capacitor C11 and the terminal 11a, and the other end of the inductor L11 is connected to the wiring line connecting the capacitor C12 and the terminal 12a.

The inductor L12 is disposed in series between the parallel arm resonator P and the ground. Specifically, the inductor L12 is connected to a terminal Pb1 of the parallel arm resonator P1 at the side opposite to the node N1 and the ground. Note that the inductor L12 may be connected to the terminal Pa1 of the parallel arm resonator P1 and the node N1.

Also, in the present embodiment, the radio frequency filter 20c satisfies the same relationship in the capacitance as that of the radio frequency filter 20a according to Embodiment 3. Specifically, the capacitance C1 between the ground and the wiring line 14a connecting the node N1 and the parallel arm resonator P1 is larger than the capacitance between the ground and the wiring line 16a connecting the terminal 11a and the capacitor C11. Accordingly, the steepness of the pass band end portion of the radio frequency filter 20c may be increased.

In addition, since the two capacitors C11 and C12 connected in series on the path 13a constituting the series arm, the inductor L11 connected in parallel to the two capacitors C11 and C12, and the parallel arm resonator P1 are provided, the degradation of the attenuation characteristic may effectively be suppressed in the radio frequency filter 20c. Accordingly, the filter characteristic of the radio frequency filter 20c may further be improved. Note that the inductor and the capacitor may be replaced with each other. Specifically, the radio frequency filter 20c may include two inductors instead of the capacitors C11 and C12, and may include a capacitor instead of the inductor L11.

The radio frequency filter 20d is an example of a second filter included in the plurality of filters included in the multiplexer 30. The radio frequency filter 20d has a configuration similar to that of the radio frequency filter 20c. Specifically, the radio frequency filter 20d includes the terminal 11b, the terminal 12b, a capacitor C21, a capacitor C22, an inductor L21, an inductor L22, and the parallel arm resonator P2. The terminal 11b, the terminal 12b, the capacitor C21, the capacitor C22, the inductor L21, the inductor L22, and the parallel arm resonator P2 correspond to the terminal 11a, the terminal 12a, the capacitor C11, the capacitor C12, the inductor L11, the inductor L12, and the parallel arm resonator P1 of the radio frequency filter 20c, respectively.

It is possible to increase the steepness of the pass band end portion of the radio frequency filter 20d as with the radio frequency filter 20c since the radio frequency filter 20d has the configuration similar to that of the radio frequency filter 20c.

Note that the capacitance values of the capacitors C11, C12, C21, and C22, and the inductance values of the inductors L11, L12, L21, and L22 are set to appropriate values in accordance with the filter characteristic of the radio frequency filters 20c and 20d.

With the above-mentioned configuration, it is possible to achieve a radio frequency module provided with a multiplexer including a filter with increased steepness of the pass band end portion.

Hereinafter, a specific example of a radio frequency module provided with the multiplexer 50 according to the present embodiment will be described. Note that the arrangements and shapes of elements, wiring substrates, wiring layers, and vias in the example described below are merely examples, and are not limited to the described examples.

EXAMPLE

A radio frequency module according to an example will be described with reference to FIG. 15A and FIG. 15B.

Figure 15A:
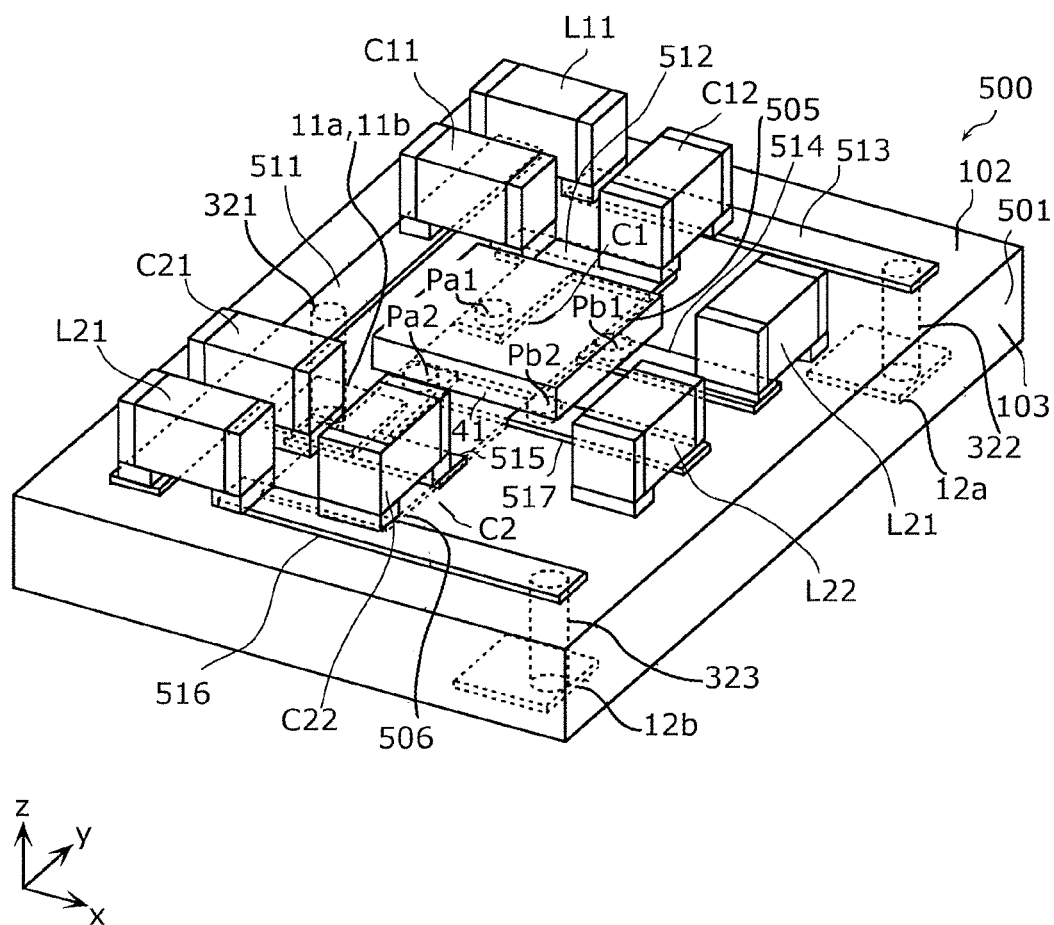
FIG. 15A is a perspective view of a radio frequency module according to an example of Embodiment 5.

FIG. 15A is a perspective view of a radio frequency module 500 according to the present example. FIG. 15B is a three-view drawing of the radio frequency module 500 according to the present example. The portions (a), (b), and (c) of FIG. 15B are a top plan, an elevation, and a right side elevation of the radio frequency module 500, respectively.

Figure 15B:
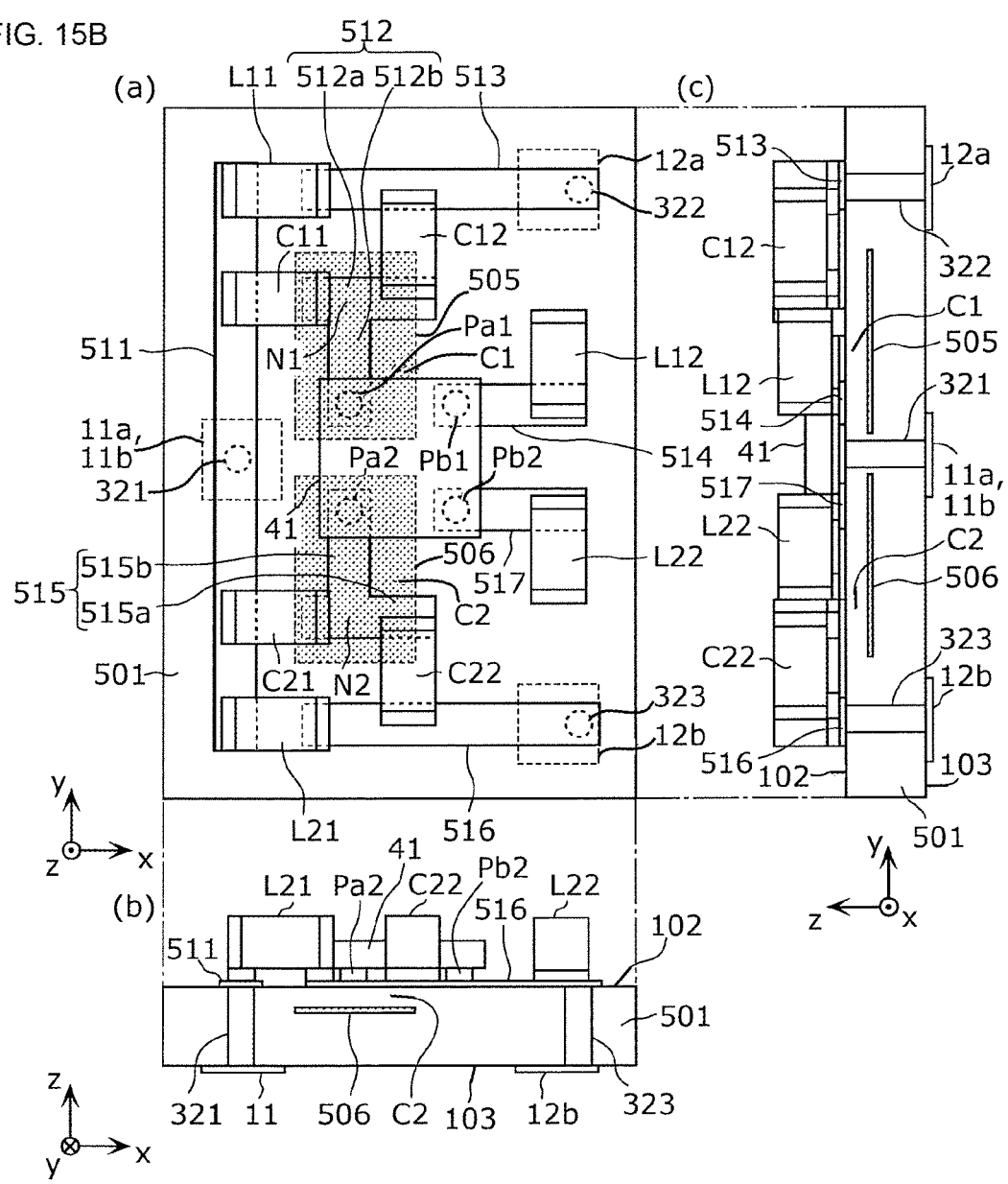
FIG. 15B is a three-view drawing of the radio frequency module according to the example of Embodiment 5.

The radio frequency module 500 includes a wiring substrate 501 and ground electrodes 505 and 506 as illustrated in FIG. 15A and FIG. 15B.

The wiring substrate 501 is the same as the wiring substrate 301 except that the number and the shapes of the wiring layers and the vias included in the wiring substrate 501 are different from those of the wiring substrate 301. The front surface 102 of the wiring substrate 501 is provided with the package 41 in which the capacitors C11, C12, C21, and C22, and the inductors L11, L12, L21, and L22, and the parallel arm resonators P1 and P2 are housed.

The wiring substrate 501 includes a wiring layer 511, a wiring layer 512, a wiring layer 513, a wiring layer 514, a wiring layer 515, a wiring layer 516, a wiring layer 517, the via 321, the via 322, and the via 323 in the present example as illustrated in FIG. 15A and FIG. 15B. The vias 321, 322, and 323 are the same as those in Example 1 of Embodiment 3.

The wiring layers 511, 512, 513, 514, 515, 516, and 517 each are conductive pattern wiring lines provided on the front surface 102 of the wiring substrate 501. The wiring layers 511, 512, 513, 514, 515, 516, and 517 are formed such that a metal thin film of silver (Ag) or copper (Cu) or the like is formed on the front surface 102, and then, the metal thin film is patterned in a predetermined shape, for example. The wiring layers 511, 512, 513, 514, 515, 516, and 517 extend in a direction parallel to the front surface 102, that is, in a direction orthogonal to the thickness direction (z-axis direction) of the wiring substrate 501. The widths and the film thicknesses of the wiring layers 511, 512, 513, 514, 515, 516, and 517 are the same as each other, for example, but may be different from each other.

The via 321, the capacitors C11 and C21, and the inductors L11 and L21 are connected to the wiring layer 511. The wiring layer 511 linearly extends along the y-axis direction from the upper end portion of the via 321 to both one end of the inductor L11 and one end of the inductor L21 as illustrated in FIG. 15A and (a) of FIG. 15B. The shape of the wiring layer 511 in top view is rectangular, for example, but is not limited thereto.

The capacitor C11, the parallel arm resonator P1, and the capacitor C12 are connected to the wiring layer 512. The wiring layer 512 includes a first wiring portion 512a and a second wiring portion 512b as illustrated in FIG. 15A and (a) of FIG. 15B. The connection portion of the first wiring portion 512a and the second wiring portion 512b is a branch point of the wiring layer 512, and corresponds to the node N1.

The capacitor C11 and the capacitor C12 are connected to the first wiring portion 512a. The first wiring portion 512a linearly extends along the x-axis direction from the other end of the capacitor C11 to one end of the capacitor C12.

The parallel arm resonator P1 is connected to the second wiring portion 512b. The second wiring portion 512b linearly extends along the y-axis direction from the first wiring portion 512a to the terminal Pa1 of the parallel arm resonator P1.

The first wiring portion 512a and the second wiring portion 512b are vertically connected to each other in top view in the present example. That is, the shape of the wiring layer 512 in top view is a T-shape, for example. The shape of the wiring layer 512 in top view may be an L-shape, a V-shape or a linear shape, for example.

The capacitor C12, the inductor L11, and the via 322 are connected to the wiring layer 513. The wiring layer 513 linearly extends along the x-axis direction from the other end of the inductor L11 to the upper end portion of the via 322.

The parallel arm resonator P1 and the inductor L12 are connected to the wiring layer 514. The wiring layer 514 linearly extends along the x-axis direction from the terminal Pb1 of the parallel arm resonator P1 to one end of the inductor L12. The shape of the wiring layer 514 in top view is rectangular, for example, but is not limited thereto. Note that the other end of the inductor L12 is connected to the ground (not illustrated).

The capacitor C21, the parallel arm resonator P2, and the capacitor C22 are connected to the wiring layer 515. The wiring layer 515 includes a first wiring portion 515a and a second wiring portion 515b as illustrated in FIG. 15A and (a) of FIG. 15B. The connection portion of the first wiring portion 515a and the second wiring portion 515b is a branch point of the wiring layer 515, and corresponds to the node N2.

The capacitor C21 and the capacitor C22 are connected to the first wiring portion 515a. The first wiring portion 515a linearly extends along the x-axis direction from the other end of the capacitor C21 to one end of the capacitor C22.

The parallel arm resonator P2 is connected to the second wiring portion 515b. The second wiring portion 515b linearly extends along the y-axis direction from the first wiring portion 515a to the terminal Pa2 of the parallel arm resonator P2.

The first wiring portion 515a and the second wiring portion 515b are vertically connected to each other in top view in the present example. That is, the shape of the wiring layer 515 in top view is a T-shape, for example. The shape of the wiring layer 515 in top view may be an L-shape, a V-shape or a linear shape, for example.

The capacitor C22, the inductor L21, and the via 323 are connected to the wiring layer 516. The wiring layer 516 linearly extends along the x-axis direction from the other end of the inductor L21 to the upper end portion of the via 323.

The parallel arm resonator P2 and the inductor L22 are connected to the wiring layer 517. The wiring layer 517 linearly extends along the x-axis direction from a terminal Pb2 of the parallel arm resonator P2 to one end of the inductor L22. The shape of the wiring layer 517 in top view is rectangular, for example, but is not limited thereto. Note that the other end of the inductor L22 is connected to the ground (not illustrated).

The elements, terminals, wiring layers, and vias included in the radio frequency module 500 are arranged in line symmetry as illustrated in (a) of FIG. 15B in the present example. The axis of the line symmetry passes through the center of the via 321 and is an axis parallel to the x-axis direction. Accordingly, the wiring lines and the elements included in the radio frequency filter 20c, and the wiring lines and the elements included in the radio frequency filter 20d can be arranged apart from each other, and therefore, the coupling between the wiring lines or the elements or the like between the radio frequency filter 20c and the radio frequency filter 20d may be suppressed.

Here, the correspondence between the wiring structure included in the radio frequency module 500 according to the present example and the wiring line included in the multiplexer 50 illustrated in FIG. 14 will be described.

The path 13a connecting the terminal 11a (terminal 11b) being the common terminal and the terminal 12a is constituted of the via 321, part of the wiring layer 511, the first wiring portion 512a of the wiring layer 512, part of the wiring layer 513, and the via 322 in the present example. The node N1 is a branch point of the wiring layer 512, and corresponds to the connection portion of the first wiring portion 512a and the second wiring portion 512b. The wiring line 14a branched from the path 13a at the node N1 is constituted of the second wiring portion 512b.

The wiring line 16a included in the path 13a is constituted of the via 321 and part of the wiring layer 511. Specifically, the part of the wiring layer 511 constituting the wiring line 16a is the portion extending from the connection portion of the wiring layer 511 and the via 321 to the connection portion of the wiring layer 511 and one end of the capacitor C11.

Further, the wiring line 26a is constituted of part of the wiring layer 513 and the via 322. Specifically, the part of the wiring layer 513 constituting the wiring line 26a is the portion extending from the connection portion of the wiring layer 513 and the other end of capacitor C12 to the connection portion of the wiring layer 513 and the via 322.

As described above, the radio frequency filter 20c and the radio frequency filter 20d are arranged in line symmetry with the axes passing through the terminal 11a (terminal 11b), which is the common input terminal, being the axes of symmetry in the present example. Thus, the wiring lines included in the radio frequency filter 20d also have the same relationship in the wiring lines as that of the radio frequency filter 20c.

The ground electrode 505 is an example of a first ground electrode overlapping with the wiring line 14a connecting the node N1 and the parallel arm resonator P1, as with the ground electrode 405 according to the example of Embodiment 4. Specifically, the ground electrode 505 overlaps with the second wiring portion 512b constituting the wiring line 14a in top view as illustrated in (a) of FIG. 15B. The ground electrode 505 is larger than the second wiring portion 512b, and the entire second wiring portion 512b is positioned inside the ground electrode 505 in top view, for example. The ground electrode 505 also overlaps with part of the first wiring portion 512a in the present example. The ground electrode 505 does not overlap with any of the wiring layers 511, 513, 514, 515, 516, and 517 in top view.

The ground electrode 506 is an example of a second ground electrode overlapping with the wiring line 14b connecting the node N2 and the parallel arm resonator P2, as with the ground electrode 406 according to the example of Embodiment 4. Specifically, the ground electrode 506 overlaps with the second wiring portion 515b constituting the wiring line 14b in top view as illustrated in (a) of FIG. 15B. The ground electrode 506 is larger than the second wiring portion 515b, and the entire second wiring portion 515b is positioned inside the ground electrode 506 in top view, for example. The ground electrode 506 also overlaps with part of the first wiring portion 515a in the present example. The ground electrode 506 does not overlap with any of the wiring layers 511, 512, 513, 514, 516, and 517 in top view.

The ground electrodes 505 and 506 are electrically isolated from each other in the wiring substrate 501 as illustrated in (a) and (c) of FIG. 15B. The ground electrode 505 and the ground electrode 506 are positioned in the same layer in the wiring substrate 501 in the thickness direction of the wiring substrate 501, for example. At this time, the ground electrode 505 and the ground electrode 506 are arranged apart from each other with a predetermined distance or more. The ground electrode 505 and the ground electrode 506 are arranged apart from each other with a distance longer than the diameter of the via 321 in top view, for example. Note that the ground electrode 505 and the ground electrode 506 may be provided in different layers in the wiring substrate 501.

The ground electrodes 505 and 506 each are connected to the ground. The ground electrodes 505 and 506 each are connected to the ground provided on the back surface 103 of the wiring substrate 501 by using such as vias (not illustrated), for example. The ground provided on the back surface 103 may be common to the ground electrodes 505 and 506. That is, although the ground electrode 505 and the ground electrode 506 are physically and electrically isolated from each other in the wiring substrate 501, they may be electrically connected to each other at the outside of the wiring substrate 501.

With the above-mentioned configuration, the capacitance C1 between the ground and the wiring line 14a connecting the node N1 and the parallel arm resonator P1 becomes larger than any of the capacitance between the wiring line 16a and the ground, and the capacitance between the wiring line 26a and the ground in the radio frequency module 500 according to the present example, and therefore, the steepness of the pass band end portion of the radio frequency filter 20c may be increased with a simple configuration as described with reference to FIGS. 2A, 2B and 2C. Similarly, the steepness of the pass band end portion of the radio frequency filter 20d may be increased with a simple configuration. Further, the isolation between the radio frequency filter 20c and the radio frequency filter 20d may be ensured since the ground electrode 505 generating the capacitance C1 and the ground electrode 506 generating the capacitance C2 are electrically isolated from each other in the wiring substrate 501. Thus, it is possible to achieve the radio frequency module 500 provided with a multiplexer including the radio frequency filters 20c and 20d with the improved filter characteristic.

[Conclusion]

As described above, in the radio frequency module according to the present embodiment, the radio frequency filter further includes the third impedance element connected in parallel to the series circuit of the first impedance element and the second impedance element. Both the first impedance element and the second impedance element are either of capacitors or inductors. The third impedance element is the other one out of a capacitor and an inductor.

Accordingly, a radio frequency filter with preferable filter characteristic may be achieved. Further, a radio frequency module provided with the multiplexer 50 including such preferable radio frequency filter may be achieved.

Embodiment 6

Subsequently, a radio frequency module according to Embodiment 6 will be described.

The radio frequency module according to the present embodiment is provided with a radio frequency front end circuit including the radio frequency filter 10 or 20 described in Embodiment 1 or 2, or at least one of the multiplexers 30, 40, and 50 described in Embodiment 3 to Embodiment 5. Hereinafter, the points different from the respective embodiments will mainly be described, and the description of points in common will be omitted or simplified.

Figure 16:
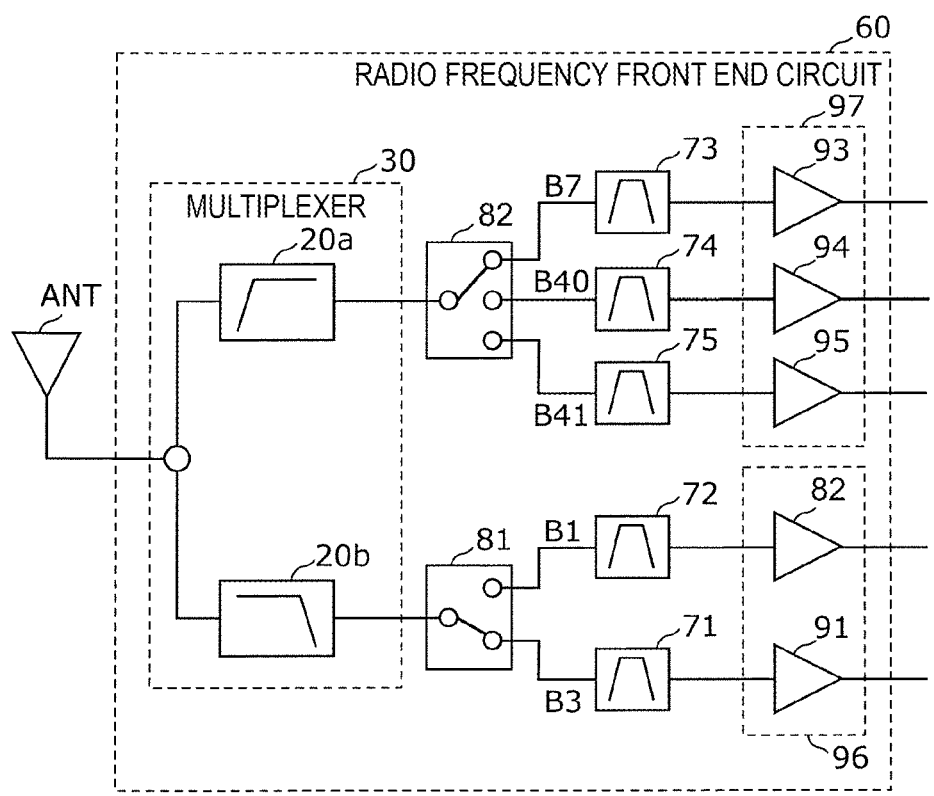
FIG. 16 is a circuit configuration diagram of a radio frequency front end circuit included in a radio frequency module according to Embodiment 6.

FIG. 16 is a circuit configuration diagram of a radio frequency front end circuit 60 provided in a radio frequency module according to the present embodiment. The radio frequency front end circuit 60 is a front end circuit for reception, and includes the multiplexer 30, switches 81 and 82, filters 71, 72, 73, 74, and 75, and reception amplifiers 91, 92, 93, 94, and 95 as illustrated in FIG. 16. Note that, an antenna element ANT is illustrated in FIG. 16. The antenna element ANT is a multi-band antenna conforming to a communication standard such as Long Term Evolution (LTE) for transmitting and receiving a radio frequency signal. The antenna element ANT and the radio frequency front end circuit 60 are disposed in a front end unit of a multi-mode/multi-band mobile phone, for example.

The multiplexer 30 includes the radio frequency filter 20a serving as a high pass filter and the radio frequency filter 20b serving as a low pass filter, for example.

The radio frequency filter 20b is a low pass filter having a pass band of the low band group frequency range (1427 MHz to 2200 MHz, for example) and an attenuation band of the high band group frequency range. The radio frequency filter 20a is a high pass filter having a pass band of the high band group frequency range (2300 MHz to 2690 MHz, for example) and an attenuation band of the low band group frequency range. At least one of the radio frequency filters 20a and 20b may be a tunable filter capable of changing the frequency range of the pass band or the attenuation band or the like.

The switch 81 is a switch element having a common terminal and two selection terminals, and the common terminal is connected to the radio frequency filter 20b. The switch 81 is an SPDT type switch circuit capable of connecting the common terminal and any one of the two selection terminals.

The switch 82 is a switch element having a common terminal and three selection terminals, and the common terminal is connected to the radio frequency filter 20a. The switch 82 is an SP3T type switch circuit capable of connecting the common terminal and any one of the three selection terminals.

The filter 71 is connected to a selection terminal of the switch 81, and is a band pass filter having a pass band of LTE Band 3 (reception band: 1805-1880 MHz), for example. The filter 72 is connected to a selection terminal of the switch 81, and is a band pass filter having a pass band of LTE Band 1 (reception band: 2110-2170 MHz), for example. The filter 73 is connected to a selection terminal of the switch 82, and is a band pass filter having a pass band of LTE Band 7 (reception band: 2620-2690 MHz), for example. The filter 74 is connected to a selection terminal of the switch 82, and is a band pass filter having a pass band of LTE Band 40 (reception band: 2300-2400 MHz), for example. The filter 75 is connected to a selection terminal of the switch 82, and is a band pass filter having a pass band of LTE Band 41 (reception band: 2496-2690 MHz), for example.

The reception amplifier 91 is connected to the filter 71, the reception amplifier 92 is connected to the filter 72, the reception amplifier 93 is connected to the filter 73, the reception amplifier 94 is connected to the filter 74, and the reception amplifier 95 is connected to the filter 75. Each of the reception amplifiers 91, 92, 93, 94, and 95 is a low-noise amplifier configured of a transistor or the like, for example. The reception amplifiers 91 and 92 constitute an amplification circuit 96. The reception amplifiers 93, 94, and 95 constitute an amplification circuit 97. Note that the amplification circuits 96 and 97 each may be configured of one reception amplifier, and in this case, an SPDT type switch is disposed between the filters 71 and 72 and the amplification circuit 96, and an SP3T type switch is disposed between the filters 73, 74, and 75 and the amplification circuit 97.

[Conclusion]

As described above, the radio frequency module according to the present embodiment is provided with a front end circuit including a multiplexer. The front end circuit includes a switch directly or indirectly connected to the multiplexer, and an amplification circuit directly or indirectly connected to the multiplexer.

Accordingly, the radio frequency front end circuit 60 including the multiplexer 30 capable of increasing the steepness of the pass band end portion of the filter may be achieved.

(Others)

Thus far, the radio frequency module according to the present disclosure has been described based on the above-mentioned embodiments, but the present disclosure is not limited to the above-mentioned embodiments.

For example, in each embodiment and each example, one or more capacitors or one or more inductors may be connected in series or in parallel to at least one of the first impedance element and the second impedance element. Further, for example, in Embodiment 5, one or more capacitors or one or more inductors may be connected in series or in parallel to at least one of the inductors L11, L12, L21, and L22.

Further, for example, the radio frequency filter may include an acoustic wave resonator disposed in series on the path connecting the input terminal and the output terminal.

Figure 17A:
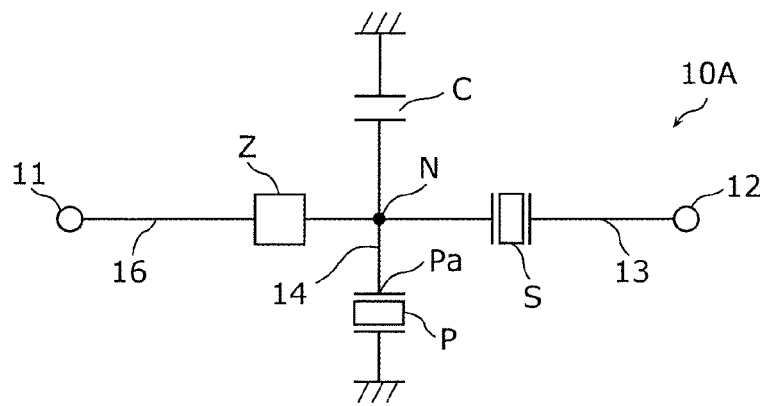
FIG. 17A is a circuit configuration diagram of a radio frequency filter included in a radio frequency module according to Modification 1.

FIG. 17A is a circuit configuration diagram of a radio frequency filter 10A included in a radio frequency module according to Modification 1. The radio frequency filter 10A is different compared to the radio frequency filter 10 illustrated in FIG. 1 in that the radio frequency filter 10A is newly provided with a series arm resonator S as illustrated in FIG. 17A.

The series arm resonator S is an example of an acoustic wave resonator disposed in series on the path connecting the terminal 11 and the terminal 12. The series arm resonator S is a resonator using SAW, a resonator using BAW, or FBAR, as with the parallel arm resonator P, for example. The series arm resonator S is connected between the node N and the terminal 12 as illustrated in FIG. 17A. That is, the series arm resonator S may be regarded as an example of the second impedance element. In other words, the second impedance element may be an acoustic wave resonator.

In this case, the capacitance value $C_2$ of the capacitance C generated in the wiring line 14 connecting the node N and the parallel arm resonator P is larger than the capacitance value $C_1$ of the capacitance generated in the wiring line 16 connecting the impedance element Z and the terminal 11, and is larger than the capacitance value of the capacitance generated in the wiring line connecting the series arm resonator S and the terminal 12. The series arm resonator S corresponds to the impedance element Z2 illustrated in FIG. 7, and the capacitance value of the capacitance generated in the wiring line connecting the series arm resonator S and the terminal 12 corresponds to the capacitance value of the capacitance between the wiring line 26 according to Embodiment 2 and the ground.

Note that the series arm resonator S may be connected between the impedance element Z and the node N. In this case, the capacitance value $C_2$ is larger than the capacitance value $C_1$ of the capacitance generated in the wiring line 16. In addition, the series arm resonator S may be connected in parallel to the impedance element Z.

Alternatively, the series arm resonator S may be connected between the terminal 11 and the impedance element Z. In this case, the terminal having a shorter wiring length to the impedance element Z is the terminal 12 since the series arm resonator S is connected between the terminal 11 and the impedance element Z. With this, the capacitance value $C_2$ is larger than the capacitance value of the capacitance generated in the wiring line connecting the impedance element Z and the terminal 12.

Figure 17B:
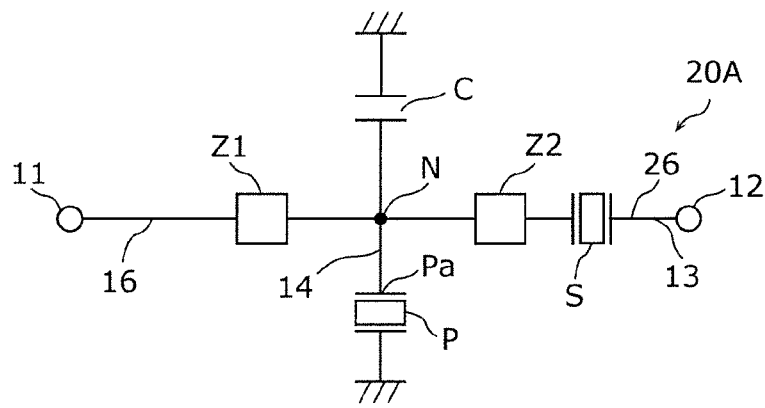
FIG. 17B is a circuit configuration diagram of a radio frequency filter included in a radio frequency module according to Modification 2.

FIG. 17B is a circuit configuration diagram of a radio frequency filter 20A included in a radio frequency module according to Modification 2. The radio frequency filter 20A is different compared to the radio frequency filter 20 illustrated in FIG. 7 in that the radio frequency filter 20A is newly provided with the series arm resonator S as illustrated in FIG. 17B.

In the example illustrated in FIG. 17B, the series arm resonator S is connected between the impedance element Z2 and the terminal 12. In this case, the capacitance value $C_2$ of the capacitance C generated in the wiring line connecting the node N and the parallel arm resonator P is larger than the capacitance value of the capacitance generated in the wiring line 16 connecting the impedance element Z1 and the terminal 11, and is larger than the capacitance value of the capacitance generated in the wiring line connecting the series arm resonator S and the terminal 12. In the present modification, the series arm resonator S may be regarded as an example of the second impedance element.

The series arm resonator S may be connected between the node N and the impedance element Z2. In this case, the impedance element Z2 is an example of the second impedance element as with Embodiment 2. That is, the capacitance value $C_2$ of the capacitance C is larger than the capacitance value of the capacitance generated in the wiring line 16 connecting the impedance element Z1 and the terminal 11, and is larger than the capacitance value of the capacitance generated in the wiring line 26 connecting the impedance element Z2 and the terminal 12. In addition, the series arm resonator S may be connected in parallel to the impedance element Z2.

One or more capacitors or one or more inductors may be connected in series or in parallel to the parallel arm resonator. In addition, an impedance variable circuit may be connected to the parallel arm resonator. Specifically, one or more capacitors or inductors may be connected in series or in parallel to the parallel arm resonator via a switch.

The acoustic wave resonator used as the parallel arm resonator P may not be limited to one resonator, but may be constituted of a plurality of divided resonators in which one resonator is divided, for example.

Further, the impedance element Z provided in the wiring substrate may be an inductor, for example. The impedance element Z may be an inductor formed of a spiral or annular pattern wiring line, for example.

Further, although a configuration of the multiplexer in which a plurality of input terminals is commonly connected to a common terminal has been described, a plurality of output terminals may be commonly connected to the common terminal, for example. At least one of the plurality of filters included in the multiplexer may be used for demultiplexing the input radio frequency signal, or may be used for multiplexing, for example. At least one of the first filter and the second filter included in the multiplexer may be used as a reception filter, or may be used as a transmission filter, for example.

Further, in Embodiment 6, the radio frequency front end circuit includes both the switch and the amplification circuit, but the radio frequency front end circuit may not include at least one of the switch and the amplification circuit, for example.

In addition, embodiments obtained by applying various modifications that those skilled in the art think about to the above embodiments, or embodiments achieved by freely combining constituent elements and functions in the above embodiments within the scope of the present disclosure are included in the present disclosure.

The present disclosure may be applied to a radio frequency filter, a multiplexer, a front end circuit, and a communication unit, and the like, and may be applied to a communication device such as a mobile phone, for example.

10, 10A, 10x, 20, 20a, 20A, 20b, 20c, 20d RADIO FREQUENCY FILTER
11, 11a, 11b TERMINAL (INPUT TERMINAL)
12, 12a, 12b TERMINAL (OUTPUT TERMINAL)
13, 13a, 13b PATH
14, 14a, 14b, 16, 16a, 16b, 26, 26a, 26b WIRING
30, 40, 50 MULTIPLEXER
41 PACKAGE
60 RADIO FREQUENCY FRONT END CIRCUIT
71, 72, 73, 74, 75 FILTER
81, 82 SWITCH
91, 92, 93, 94, 95 RECEPTION AMPLIFIER
96, 97 AMPLIFICATION CIRCUIT
100, 130, 150, 180, 200, 300, 330, 400, 500 RADIO FREQUENCY MODULE
101, 131, 151, 181, 201, 301, 331, 401, 501 WIRING SUBSTRATE
102 FRONT SURFACE (FIRST SURFACE)
103 BACK SURFACE (SECOND SURFACE)
105, 106, 135, 136, 155, 185, 205, 305, 335, 405, 406, 505, 506 GROUND ELECTRODE
111, 112, 113, 161, 162, 212, 213, 311, 312, 313, 314, 315, 341, 342, 411, 412, 413, 414, 415, 511, 512, 513, 514, 515, 516, 517 WIRING LAYER
112a, 113a, 212a, 312a, 314a, 412a, 414a, 512a, 515a FIRST WIRING
112b, 212b, 312b, 314b, 412b, 414b, 512b, 515b SECOND WIRING
121, 122, 171, 172, 173, 321, 322, 323, 351, 352, 353, 354, 355 VIA
163, 164, 184, 391, 392, 393, 394, 395, 396 ELECTRODE PLATE
ANT ANTENNA
C CAPACITANCE
C11, C12, C21, C22 CAPACITOR
L11, L12, L21, L22 INDUCTOR
N, N1, N2 NODE
P PARALLEL ARM RESONATOR
Pa, Pa1, Pa2 TERMINAL (NODE SIDE TERMINAL)
Pb1, Pb2 TERMINAL
S SERIES ARM RESONATOR
Z, Z1, Z2, Z11, Z12, Z21, Z22 IMPEDANCE ELEMENT

The invention claimed is:

1. A radio frequency module comprising:
a radio frequency filter,
wherein the radio frequency filter includes:
an input terminal,
an output terminal,
a first impedance element disposed in series on a path connecting the input terminal and the output terminal, and
an acoustic wave resonator connected between a node on the path and a ground, wherein:
the first impedance element is a capacitor or an inductor, and
a first capacitance between the ground and a first wiring line connecting the node and the acoustic wave resonator is larger than a second capacitance between the ground and a second wiring line connecting the first impedance element and a terminal out of the input terminal and the output terminal having a shorter wiring length to the first impedance element.

2. The radio frequency module according to claim 1, further comprising:
a ground electrode connected to the ground; and
a wiring substrate having a first surface and a second surface facing away from each other,
wherein the acoustic wave resonator is provided on the first surface,
the input terminal and the output terminal are provided on the second surface, and
the ground electrode overlaps with the first wiring line or a wiring line connecting the first impedance element and the node when the first surface is viewed in plan view.

3. The radio frequency module according to claim 2,
wherein the first impedance element is provided in the wiring substrate and in a position overlapping with the acoustic wave resonator when the first surface is viewed in plan view.

4. The radio frequency module according to claim 3,
wherein the ground electrode is provided between the first surface and the first impedance element in the wiring substrate.

5. The radio frequency module according to claim 2,
wherein the ground electrode is provided in the wiring substrate or on the second surface.

6. The radio frequency module according to claim 2,
wherein the wiring substrate includes:
at least one wiring layer extending in a direction parallel to the first surface and
at least one via extending in a direction orthogonal to the first surface, wherein:
each of the input terminal, the output terminal, the first impedance element, and the acoustic wave resonator is connected to at least one wiring layer and to at least one via, and
the node is a branch point in one wiring layer out of the at least one wiring layer, or a connection point of one wiring layer out of the at least one wiring layer and one via out of the at least one via.

7. The radio frequency module according to claim 1,
wherein a wiring length of the first wiring line is longer than a wiring length of the second wiring line.

8. The radio frequency module according to claim 1, further comprising:
a second impedance element disposed in series on the path,
wherein the node is positioned between the first impedance element and the second impedance element.

9. The radio frequency module according to claim 8,
wherein the second impedance element is a capacitor, an inductor, or an acoustic wave resonator.

10. The radio frequency module according to claim 8,
wherein the first capacitance is larger than a third capacitance between the ground and a third wiring line connecting the second impedance element and a terminal out of the input terminal and the output terminal having a shorter wiring length to the second impedance element.

11. The radio frequency module according to claim 8,
wherein the radio frequency filter further includes a third impedance element connected in parallel to a series circuit of the first impedance element and the second impedance element, wherein:
both the first impedance element and the second impedance element are one of a capacitor or an inductor, and
the third impedance element is the other one out of the capacitor or the inductor.

12. The radio frequency module according to claim 1,
wherein the radio frequency filter further includes an acoustic wave resonator disposed in series on the path connecting the input terminal and the output terminal.

13. The frequency module according to claim 1, further comprising:
a multiplexer including a plurality of filters including a first filter being the radio frequency filter.

14. The radio frequency module according to claim 13,
wherein the plurality of filters further includes a second filter being the radio frequency filter, and
the multiplexer includes a common terminal in which the input terminal or the output terminal included in the first filter and the input terminal or the output terminal included in the second filter are commonly connected.

15. The radio frequency module according to claim 14,
wherein the acoustic wave resonator included in the first filter and the acoustic wave resonator included in the second filter are packaged in one package.

16. The radio frequency module according to claim 15, further comprising:
a first ground electrode overlapping with the first wiring line of the first filter when viewed from one direction and being connected to the ground; and
a second ground electrode overlapping with the first wiring line of the second filter when viewed from the one direction and being connected to the ground,
wherein the first ground electrode and the second ground electrode are electrically isolated from each other in the wiring substrate.

17. The radio frequency module according to claim 14,
wherein the plurality of filters includes, as the first filter and the second filter, at least two filters out of:
a filter having a pass band including 699 MHz to 960 MHz,
a filter having a pass band including 1.2 GHz,
a filter having a pass band including 1.4 GHz to 5 GHz, and
a filter having a pass band including 5 GHz to 7.125 GHz.

18. The radio frequency module according to claim 14,
wherein the plurality of filters includes, as the first filter and the second filter, at least two filters out of:
a filter having a pass band including 699 MHz to 2.7 GHz,
a filter having a pass band including 3.3 GHz to 5 GHz, and
a filter having a pass band including 5 GHz to 7.125 GHz.

19. The radio frequency module according to claim 14,
wherein the plurality of filters includes, as the first filter and the second filter, at least two filters out of:
a filter having a pass band including 699 MHz to 2.7 GHz,
a filter having a pass band including 3.3 GHz to 4.2 GHz,
a filter having a pass band including 4.4 GHz to 5 GHz, and
a filter having a pass band including 5 GHz to 7.125 GHz.

20. The radio frequency module according to claim 13, further comprising:
a front end circuit including the multiplexer,
wherein the front end circuit includes:
a switch directly or indirectly connected to the multiplexer, and
an amplification circuit directly or indirectly connected to the multiplexer.

* * * * *

UNITED STATES PATENT AND TRADEMARK OFFICE
CERTIFICATE OF CORRECTION

PATENT NO. : 11,362,688 B2
APPLICATION NO. : 17/230572
DATED : June 14, 2022
INVENTOR(S) : Hirotsugu Mori It is certified that error appears in the above-identified patent and that said Letters Patent is hereby corrected as shown below:

In the Claims

Column 46, Line 1, "The frequency" should be -- The radio frequency --.

Signed and Sealed this
Fourteenth Day of March, 2023

Katherine Kelly Vidal
*Director of the United States Patent and Trademark Office*